(12) United States Patent
Cho et al.

(10) Patent No.: US 12,727,360 B2
(45) Date of Patent: Sep. 1, 2026

(54) DISPLAY DEVICE

(71) Applicant: Samsung Display Co., Ltd., Yongin-si (KR)

(72) Inventors: Jaehyung Cho, Yongin-si (KR); Dong-Hoon Lee, Yongin-si (KR); Mukyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/025,079

(22) Filed: Jan. 16, 2025

(65) Prior Publication Data

US 2025/0160166 A1 May 15, 2025

Related U.S. Application Data

(63) Continuation of application No. 18/191,797, filed on Mar. 28, 2023, now Pat. No. 12,232,395.

(30) Foreign Application Priority Data

Jun. 23, 2022 (KR) ........................ 10-2022-0076947

(51) Int. Cl.
*H10K 59/40* (2023.01)
*G06F 3/044* (2006.01)
(Continued)

(52) U.S. Cl.
CPC ........... *H10K 59/40* (2023.02); *G06F 3/0446* (2019.05); *H10K 59/131* (2023.02); *H10K 59/873* (2023.02); *G06F 2203/04112* (2013.01)

(58) Field of Classification Search
None
See application file for complete search history.

(56) References Cited

U.S. PATENT DOCUMENTS 9,134,870 B2 9/2015 Lee et al.
9,459,751 B2 10/2016 Weaver et al.
(Continued)

FOREIGN PATENT DOCUMENTS

CN 213276612 U 5/2021
KR 10-2018-0052830 A 5/2018
(Continued)

*Primary Examiner* — Kenneth Bukowski
(74) *Attorney, Agent, or Firm* — Womble Bond Dickinson (US) LLP

(57) ABSTRACT

A display device comprising a display panel and an input sensor comprising detection electrodes overlapping an active area, and first trace lines connected to the detection electrodes, having a portion overlapping the active area, and comprising mesh lines overlapping the active area, having a portion extending in a first direction, and comprising a first row mesh line having a portion extending in the first direction, and a second row mesh line having a portion extending in the first direction, and spaced apart from the first row mesh line in a second direction, and a second portion electrically connected to the mesh lines, overlapping the peripheral area, extending in the second direction, and comprising a first column wiring connected to the first row mesh line and extending in the second direction, and a second column wiring connected to the second row mesh line and extending in the second direction.

19 Claims, 18 Drawing Sheets

(51) Int. Cl.
*H10K 59/131* (2023.01)
*H10K 59/80* (2023.01)

(56) References Cited

U.S. PATENT DOCUMENTS 9,798,434 B2 10/2017 Lee et al.
9,811,221 B2 11/2017 Hayashi et al.
10,126,876 B2 11/2018 Hashida et al.
10,845,902 B2 11/2020 Clark et al.
11,073,955 B2* 7/2021 Kim .................... G06F 3/0412
11,112,922 B2* 9/2021 McCulloch .......... G06F 3/0448
11,416,091 B2 8/2022 Lee et al.
11,429,223 B2 8/2022 Lee et al.
11,449,182 B2 9/2022 Gogte et al.
11,449,183 B1 9/2022 Yudin et al.
2013/0242485 A1 9/2013 Ohtani et al.
2016/0209959 A1 7/2016 Lee et al.
2017/0097700 A1* 4/2017 Kim .................... G06F 3/0443
2018/0203531 A1 7/2018 Tsai
2020/0081580 A1 3/2020 Kim et al.
2020/0357857 A1 11/2020 Park et al.
2021/0026473 A1* 1/2021 Kim .................... G06F 3/04164
2021/0141491 A1 5/2021 Gogte et al.
2021/0247886 A1 8/2021 Lee et al.
2021/0333942 A1* 10/2021 Zhang .................. G06F 3/0445
2021/0405812 A1* 12/2021 He ...................... G06F 3/0443

FOREIGN PATENT DOCUMENTS

KR 10-2018-0069309 A 6/2018
KR 10-2019-0104285 A 9/2019
KR 10-2020-0008276 A 1/2020
KR 10-2020-0144733 A 12/2020
KR 10-2021-0056914 A 5/2021
KR 10-2021-0086143 A 7/2021
KR 10-2313489 B1 10/2021

* cited by examiner

TL1-11
TL1-12
TL1-13
TL1-14
CP
SP1
CD
ML1
ML2
TL1-24
TL1-23
TL1-22
TL1-21
DR1
DR2
DR3
DR4
DR5

TL1-11'
TL1-12'
CD1
CD2
CD
SP1
ML2 CD1 ML1 CD2
TL1-22'
TL1-21'
DR1
DR2
DR3
DR4
DR5

DISPLAY DEVICE

CROSS-REFERENCE TO RELATED APPLICATIONS

This continuation application claims priority to, and the benefit of U.S. application Ser. No. 18/191,797, Filed on Mar. 28, 2023, which claims priority to, and the benefit of, Korean Patent Application No. 10-2022-0076947, filed on Jun. 23, 2022, the entire contents of both, which are hereby incorporated by reference.

BACKGROUND

1. Field

The present disclosure relates to a display device having a reduced dead space.

2. Description of the Related Art

Electronic devices, such as smart phones, digital cameras, notebook computers, navigation systems, and televisions, which provide images to users, include display devices for displaying images. The display device may include a display panel that generates and displays an image and a keyboard, a mouse, or an input sensor (e.g., input-sensing unit) as an input device.

The input sensor is located on the display panel, and when a user touches an input sensor, such as a touch panel, an input signal is generated. An input signal generated from the touch panel may be provided to the display panel, and the display panel may provide an image corresponding to the input signal to the user in response to the input signal provided from the touch panel.

SUMMARY

The present disclosure provides a display device in which a dead space is reduced by reducing or minimizing an area of a portion in which a trace line included in an input sensor is located in a peripheral area.

One or more embodiments of the present disclosure provide a display device that may include a display panel including a display area and a non-display area, and an input sensor on the display panel, and including an active area overlapping the display area, a peripheral area overlapping the non-display area, detection electrodes overlapping the active area, and first trace lines connected to a portion of the detection electrodes, having at least a portion overlapping the active area, and including a first portion including mesh lines overlapping the active area, having at least a portion extending in a first direction, and including a first row mesh line having at least a portion extending in the first direction, and a second row mesh line having at least a portion extending in the first direction, and spaced apart from the first row mesh line in a second direction crossing the first direction, and a second portion electrically connected to the first portion, overlapping the peripheral area, extending in the second direction, and including a first column wiring connected to the first row mesh line and extending in the second direction, and a second column wiring connected to the second row mesh line and extending in the second direction.

The mesh lines may include a first mesh line extending in a first diagonal direction between the first direction and the second direction, and a second mesh line extending from the first mesh line in a second diagonal direction crossing the first diagonal direction.

The first mesh line and the second mesh line may cross each other.

Intersection points at which the first mesh line and the second mesh line cross each other may include a first intersection point, and a second intersection point spaced apart from the first intersection point in the second direction.

The detection electrodes may include column detection electrodes extending in the second direction, spaced apart from each other in the first direction, and connected to the first trace lines.

The column detection electrodes may include a first column detection electrode extending in the second direction, and a second column detection electrode extending in the second direction, and spaced apart from the first column detection electrode in the first direction, wherein the second portion is aligned with the first column detection electrode in the second direction.

The second portion might not be aligned with the second column detection electrode in the second direction.

The first row mesh line may be electrically connected to the first column detection electrode, wherein the second row mesh line is electrically connected to the second column detection electrode.

The first portion may further include a third row mesh line having at least a portion extending in the first direction, and spaced apart from the first row mesh line and the second row mesh line in the second direction, wherein the column detection electrodes further include a third column detection electrode extending in the second direction, spaced apart from the first column detection electrode and the second column detection electrode in the first direction, and electrically connected to the third row mesh line.

The detection electrodes may further include row detection electrodes extending in the first direction, and spaced apart in the second direction.

The input sensor further includes second trace lines connected to the row detection electrodes, having at least a portion overlapping the active area, and including a third portion overlapping the active area, having at least a portion extending in the second direction, and including mesh lines, and a fourth portion electrically connected to the third portion, overlapping the peripheral area, and having at least a portion extending in the first direction.

The row detection electrodes may include a first row detection electrode extending in the first direction, and overlapping the fourth portion based on the first direction, and a second row detection electrode extending in the first direction, and spaced apart from the first row detection electrode in the second direction.

The column detection electrodes may include a first side to which the second portion is connected, and a second side spaced apart from the first side in the second direction, wherein the input sensor further includes additional trace lines connected to the second side.

The input sensor may include a first detection insulating layer directly on the display panel, a first detection conductive layer on the first detection insulating layer, a second detection insulating layer on the first detection insulating layer, and configured to cover the first detection conductive layer, a second detection conductive layer on the second detection insulating layer, and a third detection insulating layer on the second detection insulating layer, and configured to cover the second detection conductive layer, wherein the first trace lines correspond to at least one of the first detection conductive layer and the second detection conductive layer.

The first row mesh line may include a 1-1 row mesh line corresponding to the first detection conductive layer, and a 1-2 row mesh line corresponding to the second detection conductive layer, wherein the second row mesh line includes a 2-1 row mesh line corresponding to the first detection conductive layer, and a 2-2 row mesh line corresponding to the second detection conductive layer, wherein a length of the 1-1 row mesh line is different from a length of the 2-1 row mesh line, and wherein a length of the 1-2 row mesh line is different from a length of the 2-2 row mesh line.

The second portion may include column mesh lines extending in the second direction.

The display panel may include a base layer, a circuit element layer on the base layer, and including insulating layers, a display element layer on the circuit element layer, and including a pixel-defining film and a light-emitting element, and an encapsulation layer on the display element layer, and configured to cover the light-emitting element, wherein the input sensor is directly on the encapsulation layer.

In one or more embodiments of the present disclosure, a display device may include a display panel having a display area and a non-display area, and an input sensor on the display panel, and having an active area overlapping the display area, and a peripheral area overlapping the non-display area, and including detection electrodes overlapping the active area, and including column detection electrodes extending in a second direction, and spaced apart from each other in a first direction crossing the second direction, and first trace lines connected to a portion of the detection electrodes, having at least a portion overlapping the active area, and including a first portion including mesh lines overlapping the active area, and having at least a portion extending in the first direction, and a second portion electrically connected to the first portion, overlapping the peripheral area, extending in the second direction, and aligned with any one of the column detection electrodes, while not overlapping others of the column detection electrodes, based on the second direction.

The first portion may include a first row mesh line having at least a portion extending in the first direction, and a second row mesh line having at least a portion extending in the first direction and spaced apart from the first row mesh line in the second direction, wherein the column detection electrodes include a first column detection electrode extending in the second direction, and electrically connected to the first row mesh line, and a second column detection electrode extending in the second direction, spaced apart from the first column detection electrode in the first direction, and electrically connected to the second row mesh line.

In one or more embodiments of the present disclosure, a display device may include a display panel including a display area and a non-display area, and an input sensor on the display panel, and including an active area overlapping the display area, a peripheral area overlapping the non-display area, detection electrodes overlapping the active area, and first trace lines connected to a portion of the detection electrodes, having at least a portion overlapping the active area, and including a first portion overlapping the active area and extending in a first direction, and a second portion electrically connected to the first portion, overlapping the peripheral area, and extending in a second direction crossing the first direction, wherein at least a portion of the first portion and the second portion includes a first mesh line extending in a first diagonal direction between the first direction and the second direction, and a second mesh line extending from the first mesh line in a second diagonal direction crossing the first diagonal direction, and crossing the first mesh line.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings.

DETAILED DESCRIPTION

Figure 1A:
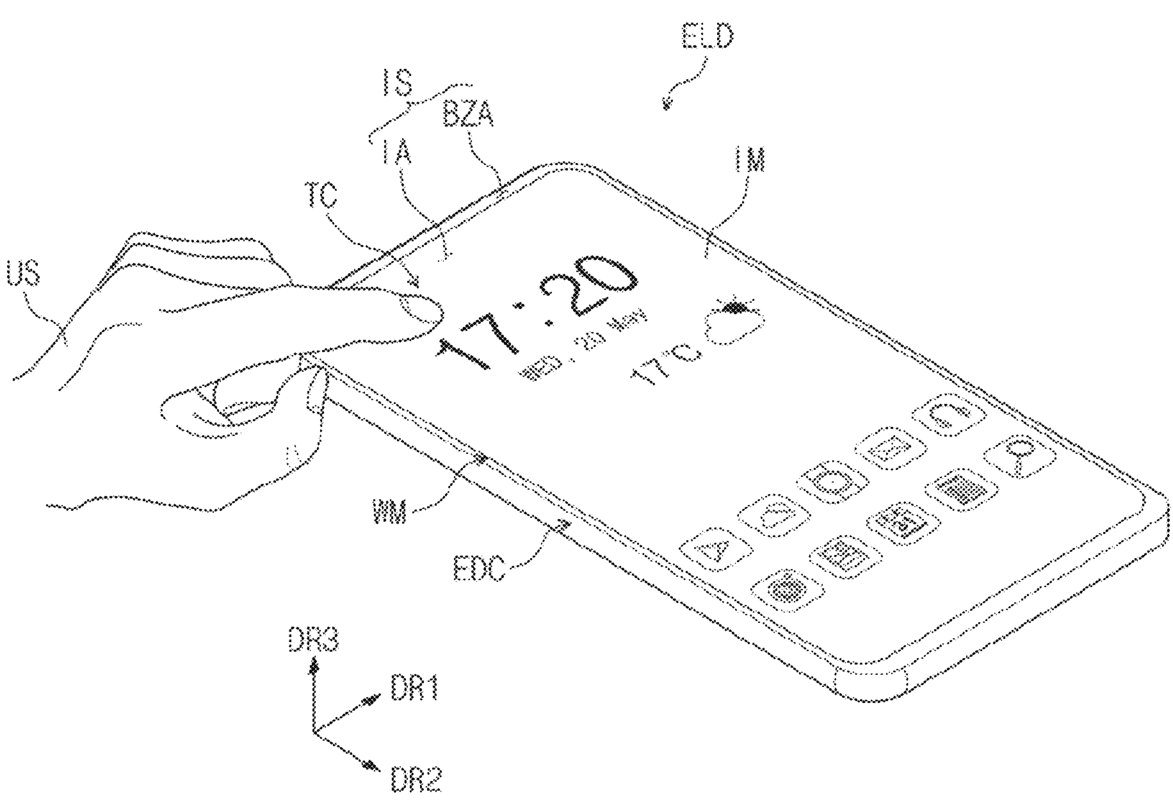
FIG. 1A is a perspective view of an electronic device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as “beneath,” “below,” “lower,” “lower side,” “under,” “above,” “upper,” “upper side,” and the like, may be used herein for ease of explanation to describe one element or feature’s relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as “below” or “beneath” or “under” other elements or features would then be oriented “above” the other elements or features. Thus, the example terms “below” and “under” can encompass both an orientation of above and below. The device may be otherwise oriented (e.g., rotated 90 degrees or at other orientations) and the spatially relative descriptors used herein should be interpreted accordingly. Similarly, when a first part is described as being arranged “on” a second part, this indicates that the first part is arranged at an upper side or a lower side of the second part without the limitation to the upper side thereof on the basis of the gravity direction.

Further, the phrase “in a plan view” means when an object portion is viewed from above, and the phrase “in a schematic cross-sectional view” means when a schematic cross-section taken by vertically cutting an object portion is viewed from the side. The terms “overlap” or “overlapped” mean that a first object may be above or below or to a side of a second object, and vice versa. Additionally, the term “overlap” may include layer, stack, face or facing, extending over, covering, or partly covering or any other suitable term as would be appreciated and understood by those of ordinary skill in the art. The expression “not overlap” may include meaning, such as “apart from” or “set aside from” or “offset from” and any other suitable equivalents as would be appreciated and understood by those of ordinary skill in the art. The terms “face” and “facing” may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being “formed on,” “on,” “connected to,” or “coupled to” another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being “electrically connected” or “electrically coupled” to another layer, region, or component, it can be directly electrically connected or coupled to the other layer, region, and/or component or intervening layers, regions, or components may be present. However, “directly connected/directly coupled,” or “directly on,” refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed “under”

another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
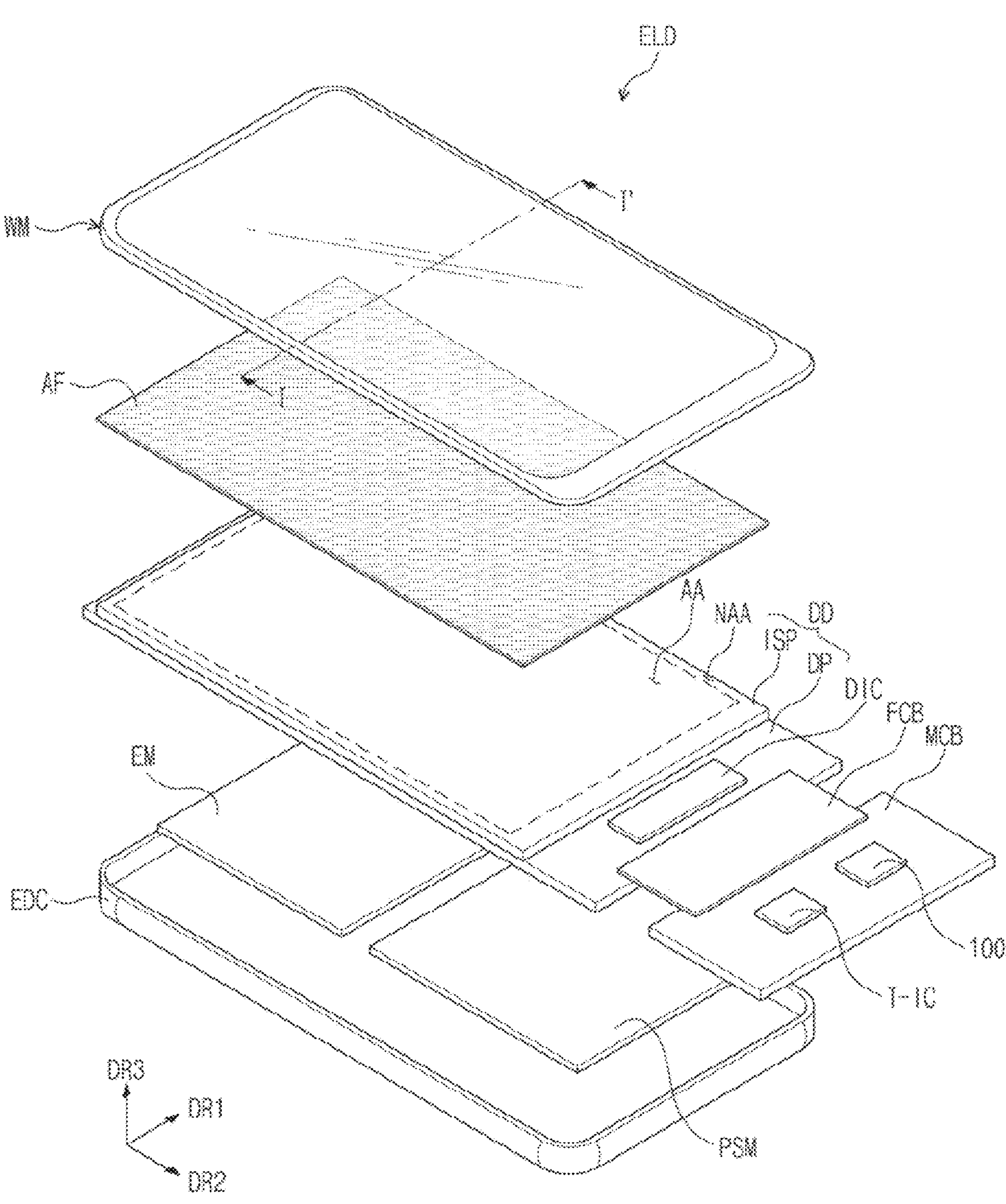
FIG. 1B is an exploded perspective view of an electronic device according to one or more embodiments of the present disclosure.
Figure 2A:
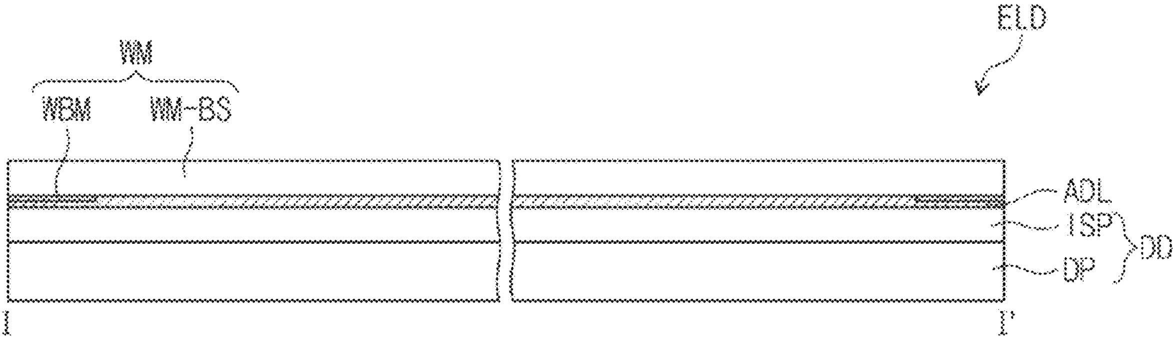
FIGS. 2A and 2B are each a cross-sectional view of an electronic device according to one or more embodiments of the present disclosure.
Figure 2B:
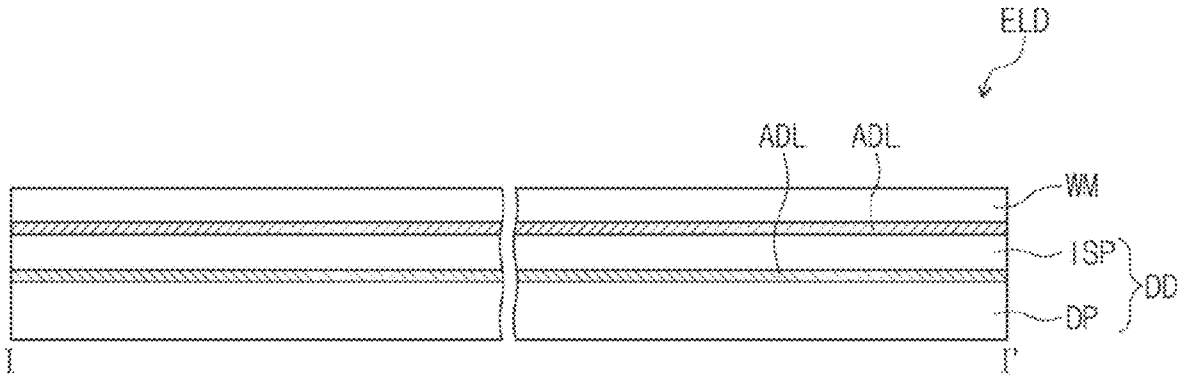
Figure 2C:
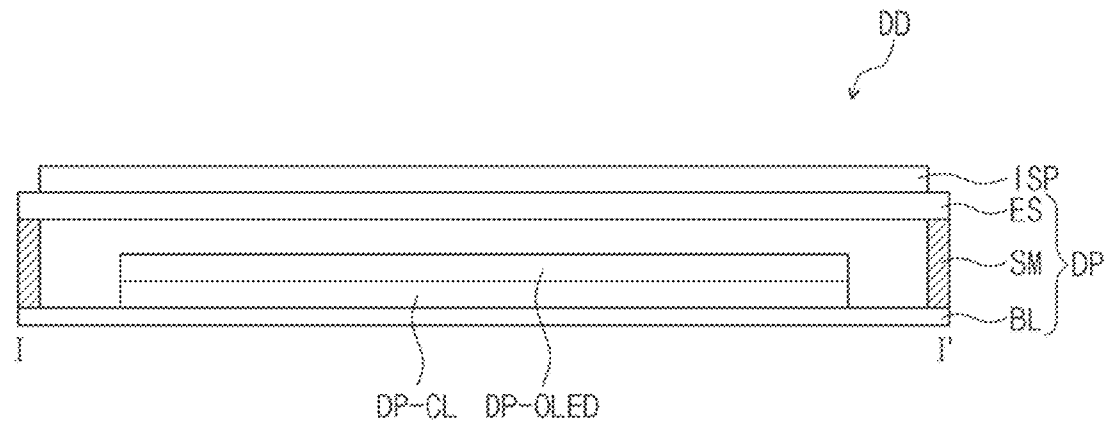
FIGS. 2C and 2D are each a cross-sectional view of a display device according to one or more embodiments of the present disclosure.
Figure 2D:
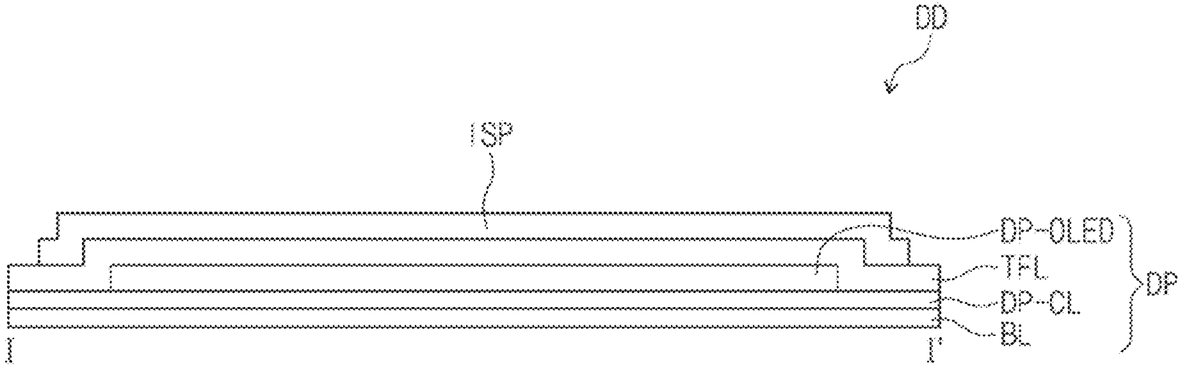

FIG. 1A is a perspective view of an electronic device according to one or more embodiments of the present disclosure. FIG. 1B is an exploded perspective view of an electronic device according to one or more embodiments of the present disclosure. FIGS. 2A and 2B are each a cross-sectional view of an electronic device according to one or more embodiments of the present disclosure. FIGS. 2A and 2B are respectively cross-sectional views of the electronic device taken along the line I-I' shown in FIG. 1B. FIGS. 2C and 2D are each a cross-sectional view of a display device according to one or more embodiments of the present disclosure. FIGS. 2C and 2D are each a cross-sectional view of a display device taken along the line I-I' of FIG. 1B.

Referring to FIGS. 1A to 1B, the electronic device ELD may be a device activated according to an electrical signal. The electronic device ELD may be, for example, a smart phone, a tablet, a laptop computer, a computer, or a smart television.

The electronic device ELD may display the image IM toward the third direction DR3 on the display surface IS that is parallel to each of the first and second directions DR1 and DR2. The display surface IS on which the image IM is displayed may correspond to a front surface of the electronic device ELD. The image IM may include a still image as well as a dynamic or moving image.

In one or more embodiments, the front (or upper surface) and the rear surface (or lower surface) of each member are defined based on the direction in which the image IM is displayed. The front and rear surfaces are opposing to each other in the third direction DR3, and a normal direction of each of the front and rear surfaces may be parallel to the third direction DR3.

The separation distance between the front and rear surfaces in the third direction DR3 may correspond to the thickness in the third direction DR3 of the electronic device ELD. Meanwhile, the directions indicated by the first to third directions DR1, DR2, and DR3 may be defined differently from those defined in FIG. 1A.

The electronic device ELD may detect an external input applied from the outside. The external input may include various inputs provided from the outside of the electronic device ELD. The electronic device ELD may detect an externally applied input TC. The input TC is an input by a passive type input means, and may be an input by the body of the user US, and may include all inputs capable of changing the capacitance of the input sensor. The electronic device ELD may detect the input TC of the user US applied to the side or the rear of the electronic device ELD according to the structure of the electronic device ELD, and is not limited to any one or more embodiments.

The front surface of the electronic device ELD may include an image area IA and a bezel area BZA. The image area IA may be an area in which the image IM is displayed. The user visually recognizes the image IM through the image area IA. In one or more embodiments, the image area IA is shown in a rectangular shape in which vertices are rounded. However, this is illustrated by way of example, and the image area IA may have various shapes, and is not limited to any one or more embodiments.

The bezel area BZA is adjacent to the image area IA. The bezel area BZA may have a color (e.g., predetermined color). The bezel area BZA may surround the image area IA. Accordingly, the shape of the image area IA may be substantially defined by the bezel area BZA. However, in one or more other embodiments, the bezel area BZA may be located adjacent to only one side of the image area IA, or may be omitted. The electronic device ELD according to one or more embodiments of the present disclosure may include various embodiments, and is not limited to any one or more embodiments.

As shown in FIG. 1B, the electronic device ELD may include a display device DD, an optical member AF, a window WM, an electronic module EM, a power module PSM, and a case EDC. The display device DD generates an image and detects an external input. The display device DD may include a display panel DP and an input sensor ISP. The display device DD includes an active area AA and a peripheral area NAA respectively corresponding to the image area IA (refer to FIG. 1A) and the bezel area BZA of the electronic device ELD (refer to FIG. 1A).

The display panel DP is not particularly limited and may be, for example, a light-emitting display panel, such as an organic light-emitting display panel or an inorganic light-emitting display panel. A detailed description of the input sensor ISP will be described later.

The display device DD may further include a main circuit board MCB, a flexible circuit film FCB and a driving circuit DIC, a sensor control circuit T-IC, and a main controller 100. Any one or more of these may be omitted. Each of the driving circuit DIC, the sensor control circuit T-IC, and the main controller 100 may be provided in the form of an integrated chip. The main circuit board MCB may be electrically connected to the display panel DP by being connected to the flexible circuit film FCB. The main circuit board MCB may include a plurality of driving elements. The main circuit board MCB may be electrically connected to the electronic module EM through a connector.

The flexible circuit films FCB are connected to the display panel DP to electrically connect the display panel DP and the main circuit board MCB. The display panel DP may be bent so that the flexible circuit film FCB and the main circuit board MCB face the rear surface of the display device DD.

Although FIG. 1B illustrates the driving circuit DIC mounted on the display panel DP, the driving circuit DIC may be mounted on the flexible circuit film FCB. The driving circuit DIC may include driving elements for driving the pixels of the display panel DP, for example, a data driving circuit.

In one or more embodiments, the input sensor ISP may be electrically connected to the main circuit board MCB through an additional flexible circuit film. However, embodiments of the present disclosure are not limited thereto. The input sensor ISP may be electrically connected to the display panel DP and electrically connected to the main circuit board MCB through the flexible circuit film FCB.

The optical member AF lowers the external light reflectance. The optical member AF may include a polarizer and a retarder. The polarizer and retarder may be of a stretch type or a coating type. The optical axis of the coated optical film is defined according to the stretching direction of the functional film. The coated optical film may include liquid crystal molecules arranged on the base film.

In one or more embodiments of the present disclosure, the optical member AF may be omitted. In this case, the display device DD may further include a color filter and a black matrix replacing the optical member AF. The color filter and the black matrix may be directly located on the upper surface of the input sensor ISP through a continuous process. The upper surface of the input sensor ISP is provided by the uppermost insulating layer of the input sensor ISP.

The window WM provides an outer surface of the electronic device ELD. The window WM includes a base substrate and may further include functional layers, such as an anti-reflection layer and an anti-fingerprint layer.

In one or more other embodiments, the display device DD may further include at least one adhesive layer. The adhesive layer may bond adjacent components of the display device DD. The adhesive layer may be an optically transparent adhesive layer or a pressure-sensitive adhesive layer.

The electronic module EM includes at least a main controller. The electronic module EM may include a wireless communication module, an image input module, a sound input module, a sound output module, a memory, and an external interface module. The modules may be mounted on the circuit board or electrically connected through a flexible circuit board. The electronic module EM may be electrically connected to the power module PSM.

The main controller controls the overall operation of the electronic device ELD. For example, the main controller activates or deactivates the display device DD according to a user input. The main controller may control operations of the display device DD, the wireless communication module, the image input module, the sound input module, and the sound output module. The main controller may include at least one microprocessor.

The case EDC may be combined with the window WM. The case EDC absorbs shock applied from the outside, and reduces or prevents foreign matter/moisture penetrating into the display device DD to protect the components contained in the case EDC. Meanwhile, in one or more embodiments of the present disclosure, the case EDC may be provided in a form in which a plurality of storage members are combined.

Referring to FIG. 2A, the input sensor ISP may be directly located on the display panel DP. According to one or more embodiments of the present disclosure, the input sensor ISP may be formed on the display panel DP by a continuous process. That is, when the input sensor ISP is located directly on the display panel DP, the adhesive layer is not located between the input sensor ISP and the display panel DP. However, as shown in FIG. 2B, an adhesive layer ADL may be located between the input sensor ISP and the display panel DP. In this case, the input sensor ISP is not manufactured by a continuous process with the display panel DP, and after manufactured through a process separate from that of the display panel DP, the input sensor ISP may be fixed to the upper surface of the display panel DP by the adhesive layer ADL. Referring to FIGS. 2A and 2B, the optical member AF shown in FIG. 1B is not shown. Also, a configuration located below the display device DD is not shown.

As shown in FIG. 2A, the window WM may include a light-blocking pattern WBM for defining the bezel area BZA (refer to FIG. 1A). The light-blocking pattern WBM is a colored organic film and may be formed on one surface of the base layer WM-BS by, for example, a coating method.

As shown in FIG. 2C, the display panel DP includes a base layer BL, a circuit element layer DP-CL located on the base layer BL, a display element layer DP-OLED, an encapsulation substrate ES, and a sealant SM that bonds the base layer BL to the encapsulation substrate ES.

The base layer BL may include at least one plastic film. The base layer BL may include a plastic substrate, a glass substrate, a metal substrate, or an organic/inorganic composite material substrate. In one or more embodiments, the base layer BL may be a thin glass substrate having a thickness of several tens to several hundreds of micrometers. The base layer BL may have a multilayer structure. For example, the base layer BL may include a multilayer structure of an organic layer (e.g., polyimide layer)/at least one inorganic layer/an organic layer (e.g., polyimide layer).

The circuit element layer DP-CL includes at least one insulating layer and a circuit element. The insulating layer includes at least one inorganic layer and at least one organic layer. The circuit element includes signal lines, a pixel circuit, and the like. A detailed description of this will be described later.

The display element layer DP-OLED includes at least a light-emitting element. The display element layer DP-OLED may further include an organic layer, such as a pixel-defining film.

The encapsulation substrate ES may be spaced apart from the display element layer DP-OLED with a gap (e.g., predetermined gap) GP. The base layer BL and the encapsulation substrate ES may include a plastic substrate, a glass substrate, a metal substrate, or an organic/inorganic composite material substrate. The sealant SM may include an organic adhesive or frit. A material (e.g., predetermined material) may be filled in the gap GP. A moisture absorbent or resin material may be filled in the gap GP.

As shown in FIG. 2D, the display panel DP includes a base layer BL, a circuit element layer DP-CL located on the base layer BL, a display element layer DP-OLED, and an upper insulating layer TFL. The upper insulating layer TFL includes a plurality of thin films. The upper insulating layer TFL may include a protective layer for protecting the light-emitting element. The upper insulating layer TFL may include a thin film encapsulation layer including a structure of at least one inorganic layer/organic layer/inorganic layer. The thin film encapsulation layer may be located on the protective layer.

Figure 3:
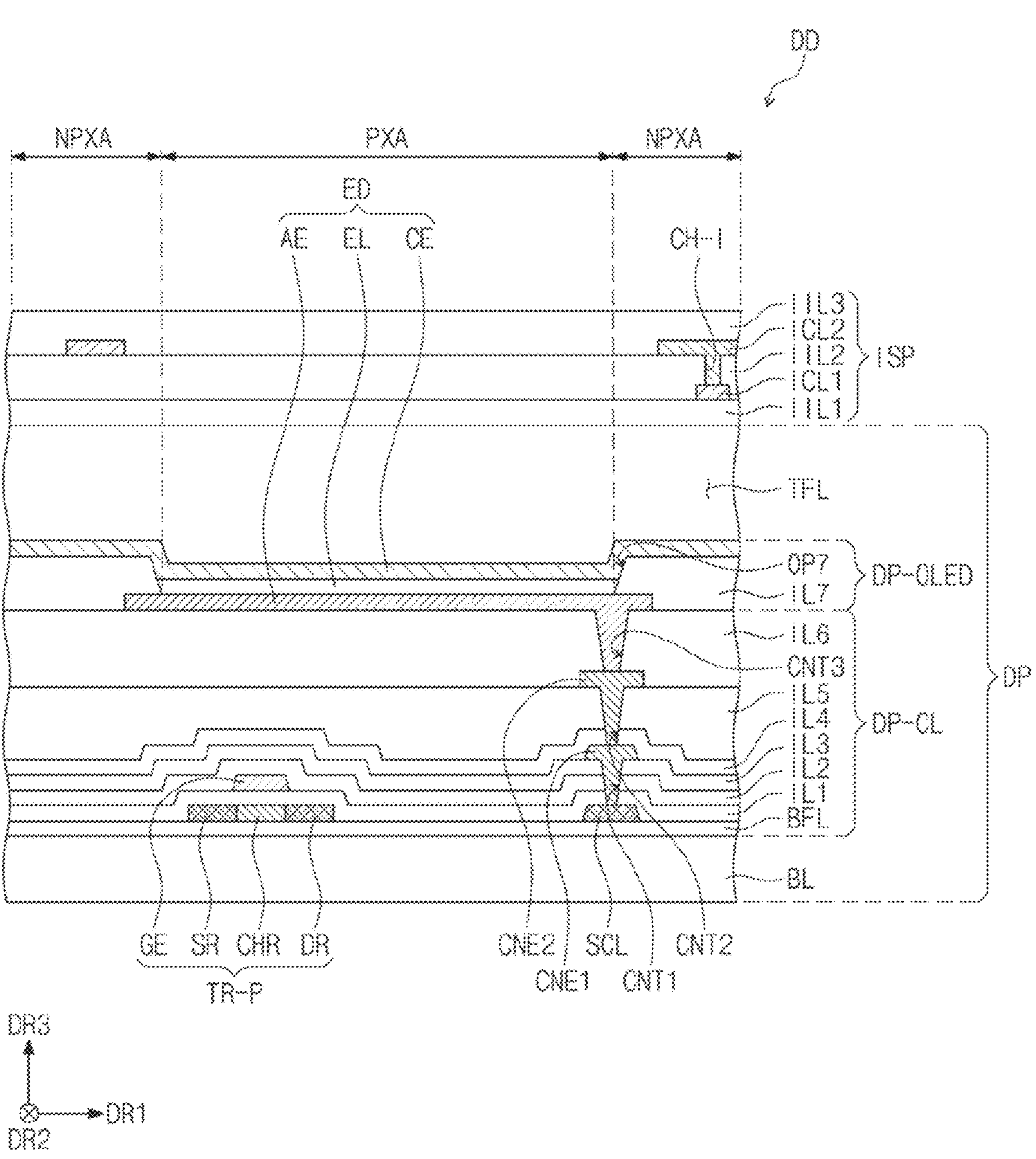
FIG. 3 is an enlarged cross-sectional view of a display device according to one or more embodiments.

FIG. 3 is an enlarged cross-sectional view of a display device according to one or more embodiments of the present disclosure. FIG. 3 is shown based on the display device of FIG. 2D.

Referring to FIG. 3, the display device DD may include a display panel DP, and an input sensor ISP located directly on the display panel DP. The display panel DP may include a base layer BL, a circuit element layer DP-CL, a display element layer DP-OLED, and an upper insulating layer TFL.

The display device DD may include an active area AA and a peripheral area NAA described with reference to FIG. 1B, and each of the display panel DP and the input sensor ISP may include an area corresponding to each of the active area AA and the peripheral area NAA of the display device DD. FIG. 3 shows an enlarged view of a partial area of the active area AA.

The base layer BL may provide a base surface on which the circuit element layer DP-CL is located. The circuit element layer DP-CL may be located on the base layer BL. The circuit element layer DP-CL may include an insulating layer, a semiconductor pattern, a conductive pattern, and a signal line. An insulating layer, a semiconductor layer, and a conductive layer are formed on the base layer BL by a method, such as coating and deposition, and thereafter, the insulating layer, the semiconductor layer, and the conductive layer may be selectively patterned through a plurality of photolithography processes. Thereafter, a semiconductor pattern, a conductive pattern, and a signal line included in the circuit element layer DP-CL may be formed.

At least one inorganic layer is formed on the upper surface of the base layer BL. In one or more embodiments, the display panel DP is shown to include the buffer layer BFL. The buffer layer BFL may improve bonding force between the base layer BL and the semiconductor pattern. The buffer layer BFL may include a silicon oxide layer and a silicon nitride layer, and a silicon oxide layer and a silicon nitride layer may be alternately stacked.

The semiconductor pattern may be located on the buffer layer BFL. The semiconductor pattern may include polysilicon. However, the present disclosure is not limited thereto, and the semiconductor pattern may include amorphous silicon or metal oxide.

FIG. 3 illustrates only some semiconductor patterns, and semiconductor patterns may be further located in other areas. The semiconductor pattern may be arranged in a specific rule across the pixels. Semiconductor patterns may have different electrical properties depending on whether they are doped or not. The semiconductor pattern may include a first area having high conductivity and a second area having low conductivity. The first area may be doped with an N-type dopant or a P-type dopant. P-type transistors include a doped area that is doped with a P-type dopant. The second area may be a non-doped area or may be doped with a lower concentration than the first area.

The conductivity of the first area is greater than that of the second area, and substantially serves as an electrode or a signal line. The second area may substantially correspond to an active area (or channel area) of the pixel transistor TR-P. In other words, a part of the semiconductor pattern may be an active area of the transistor, and the other part may be a source area or a drain area of the transistor.

Each of the pixels may have an equivalent circuit including seven transistors, one capacitor, and a light-emitting element, and the equivalent circuit diagram of the pixel may be modified in various forms. FIG. 3 illustrates one pixel transistor TR-P and a light-emitting element ED included in a pixel.

A source area SR, a channel area CHR, and a drain area DR of the pixel transistor TR-P may be formed from a semiconductor pattern. The source area SR and the drain area DR may respectively extend in opposite directions from the channel area CHR on a cross-section. FIG. 3 illustrates a portion of the signal transmission area SCL formed as the first area of the semiconductor pattern. In one or more other embodiments, the signal transmission area SCL may be electrically connected to the pixel transistor TR-P on a plane.

The first insulating layer IL1 may be located on the buffer layer BFL. The first insulating layer IL1 may overlap a plurality of pixels in common, and may cover a semiconductor pattern. The first insulating layer IL1 may be an inorganic layer and/or an organic layer, and may have a single layer or multilayer structure. The first insulating layer IL1 may include at least one of aluminum oxide, titanium oxide, silicon oxide, silicon nitride, silicon oxynitride, zirconium oxide, and/or hafnium oxide. In one or more embodiments, the first insulating layer IL1 may be a single-layer silicon oxide layer. The first insulating layer IL1 as well as the insulating layer of the circuit element layer DP-CL to be described later may be an inorganic layer and/or an organic layer, and may have a single layer or multilayer structure. The inorganic layer may include at least one of the above-mentioned materials, but is not limited thereto.

The gate GE of the pixel transistor TR-P is located on the first insulating layer IL1. The gate GE may be a part of the metal pattern. The gate GE overlaps the channel area CHR. In the process of doping the semiconductor pattern, the gate GE may function as a mask.

The second insulating layer IL2 is located on the first insulating layer IL1 and may cover the gate GE. The second insulating layer IL2 may overlap the pixels in common. The second insulating layer IL2 may be an inorganic layer and/or an organic layer, and may have a single layer or multilayer structure. In one or more embodiments, the second insulating layer IL2 may be a single-layer silicon oxide layer.

The third insulating layer IL3 may be located on the second insulating layer IL2, and the third insulating layer IL3 may be a single layer of silicon oxide. The first connection electrode CNE1 may be located on the third insulating layer IL3. The first connection electrode CNE1 may be connected to the signal transmission area SCL through a contact hole CNT1 penetrating the first, second, and third insulating layers IL1, IL2, and IL3.

The fourth insulating layer IL4 may be located on the third insulating layer IL3. The fourth insulating layer IL4 may be a single layer of silicon oxide. The fifth insulating layer IL5 may be located on the fourth insulating layer IL4. The fifth insulating layer IL5 may be an organic layer.

The second connection electrode CNE2 may be located on the fifth insulating layer IL5. The second connection electrode CNE2 may be connected to the first connection electrode CNE1 through a contact hole CNT2 penetrating the fourth insulating layer IL4 and the fifth insulating layer IL5.

The sixth insulating layer IL6 is located on the fifth insulating layer IL5 and may cover the second connection electrode CNE2. The sixth insulating layer IL6 may be an organic layer. The display element layer DP-OLED may be located on the circuit element layer DP-CL. The display element layer DP-OLED may include a light-emitting element ED. The light-emitting element ED may include a first electrode AE, a light-emitting layer EL, and a second electrode CE. For example, the light-emitting layer EL may include an organic light-emitting material, a quantum dot, a quantum rod, a micro-LED, or a nano-LED.

The first electrode AE may be located on the sixth insulating layer IL6. The first electrode AE may be connected to the second connection electrode CNE2 through a contact hole CNT3 penetrating the sixth insulating layer IL6.

The pixel-defining film IL7 is located on the sixth insulating layer IL6 and may cover a part of the first electrode AE. An opening part OP7 is defined in the pixel-defining film IL7. The opening part OP7 of the pixel-defining film IL7 exposes at least a portion of the first electrode AE. The emission area PXA is defined to correspond to a partial area of the first electrode AE exposed by the opening part OP7. The non-emission area NPXA may surround the emission area PXA.

The light-emitting layer EL may be located on the first electrode AE. The light-emitting layer EL may be located to correspond to the opening part OP7. That is, the light-emitting layer EL may be formed separately on each of the pixels. When the light-emitting layer EL is formed separately on each of the pixels, each of the light-emitting layers EL may emit light of at least one color of blue, red, and green. However, the present disclosure is not limited thereto, and the light-emitting layer EL may be connected to the pixels and provided in common. In this case, the light-emitting layer EL may provide blue light or white light.

The second electrode CE may be located on the light-emitting layer EL. The second electrode CE has an integral shape and may be commonly located on a plurality of pixels. A common voltage may be provided to the second electrode CE, and the second electrode CE may be referred to as a common electrode.

In one or more embodiments, a hole control layer may be located between the first electrode AE and the light-emitting layer EL. The hole control layer may be commonly located in the emission area PXA and the non-emission area NPXA. The hole control layer may include a hole transport layer, and may further include a hole injection layer. An electron control layer may be located between the light-emitting layer EL and the second electrode CE. The electron control layer may include an electron transport layer, and may further include an electron injection layer. The hole control layer and the electron control layer may be commonly formed in a plurality of pixels using an open mask.

The input sensor ISP may be directly formed on the upper surface of the upper insulating layer TFL through a continuous process. The input sensor ISP may include a first detection insulating layer IIL1, a first detection conductive layer ICL1, a second detection insulating layer IIL2, a second detection conductive layer ICL2, and a third detection insulating layer IIL3. In one or more embodiments of the present disclosure, the first detection insulating layer IIL1 may be omitted.

Each of the first detection conductive layer ICL1 and the second detection conductive layer ICL2 may have a single layer structure, or may include a plurality of patterns having a multilayer structure stacked along the third direction DR3. The single-layered conductive layer may include a metal layer or a transparent conductive layer. The metal layer may include molybdenum, silver, titanium, copper, aluminum, or an alloy thereof. The transparent conductive layer may include a transparent conductive oxide, such as indium tin oxide (ITO), indium zinc oxide (IZO), zinc oxide (ZnO), indium zinc tin oxide (IZTO), and the like. In addition, the transparent conductive material may include a conductive polymer, such as PEDOT, metal nanowires, graphene, and the like.

The multilayered conductive layer may include metal layers. The metal layers may have a three-layer structure of, for example, titanium/aluminum/titanium. The multilayered conductive layer may include at least one metal layer and at least one transparent conductive layer.

The second detection insulating layer IIL2 covers the first detection conductive layer ICL1, and the third detection insulating layer IIL3 covers the second detection conductive layer ICL2. Although the first detection insulating layer IIL1 to the third detection insulating layer IIL3 are illustrated as a single layer, the present disclosure is not limited thereto.

At least one of the first detection insulating layer IIL1 and the second detection insulating layer IIL2 may include an inorganic film. The inorganic film may include at least one of aluminum oxide, titanium oxide, silicon oxide, silicon nitride, silicon oxynitride, zirconium oxide, and/or hafnium oxide.

The third detection insulating layer IIL3 may include an organic layer. The organic film may include at least one of acrylic resin, methacrylic resin, polyisoprene, vinyl resin, epoxy resin, urethane resin, cellulose resin, siloxane resin, polyimide resin, polyamide resin, and/or perylene resin.

Figure 4A:
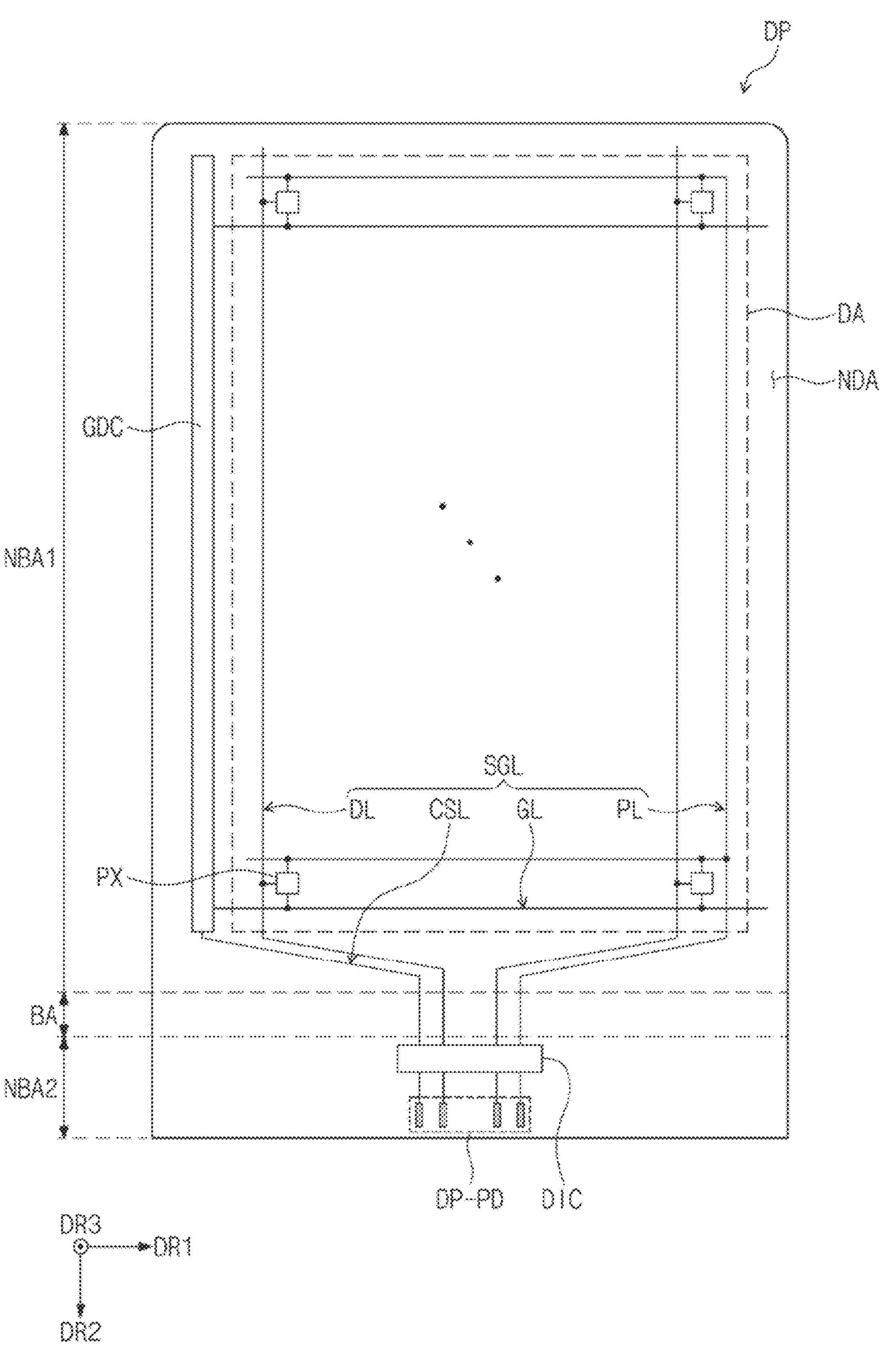
FIG. 4A is a plan view of a display panel according to one or more embodiments.
Figure 4B:
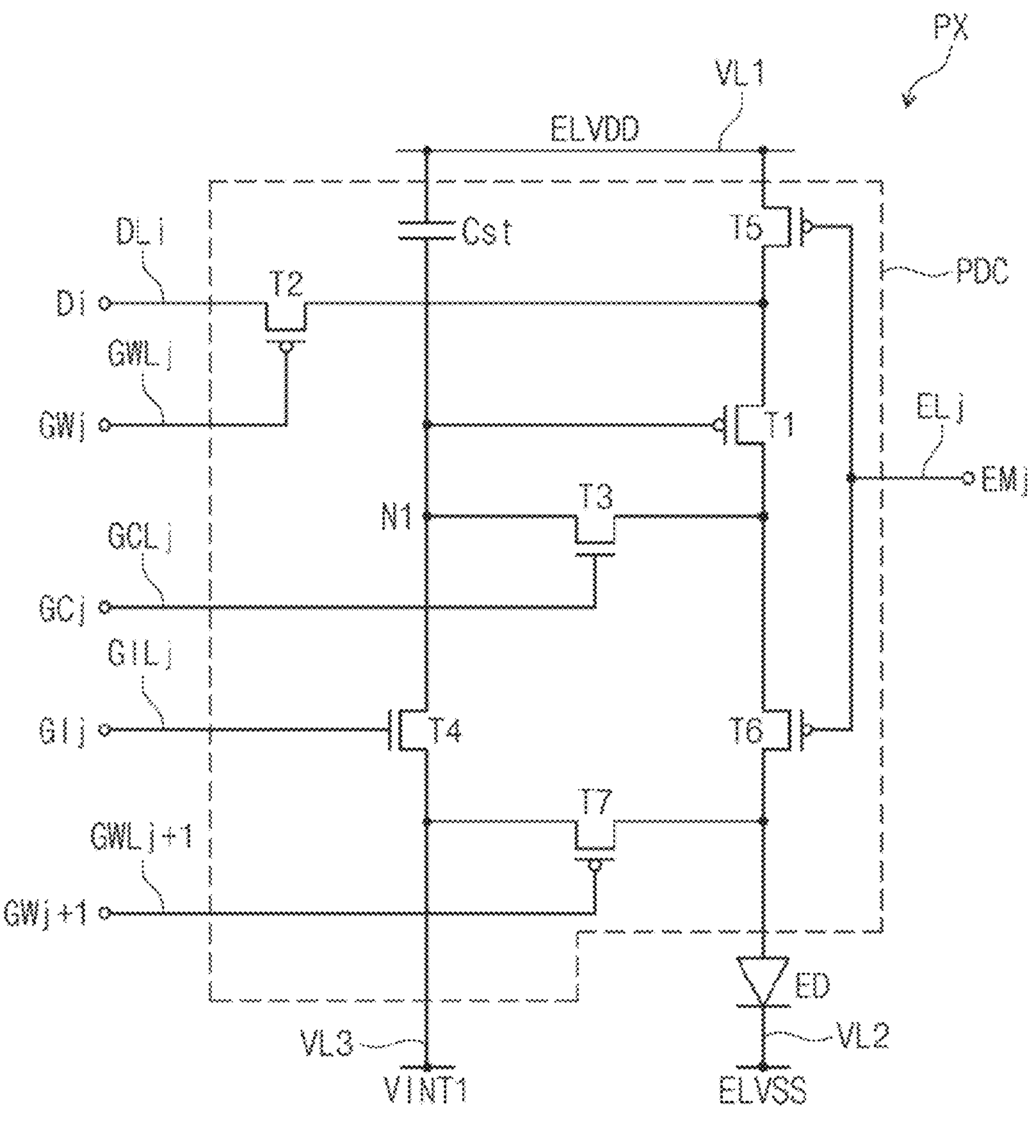
FIG. 4B is a circuit diagram illustrating a pixel according to one or more embodiments of the present disclosure.

FIG. 4A is a plan view of a display panel according to one or more embodiments of the present disclosure. FIG. 4B is a circuit diagram illustrating a pixel according to one or more embodiments of the present disclosure.

Referring to FIG. 4A, the display panel DP may be divided into a display area DA and a non-display area NDA in a plan view. The display area DA of the display panel DP may be an area in which an image is displayed, and the non-display area NDA may be an area in which a driving circuit or driving wiring is located. Light-emitting elements of each of the plurality of pixels PX may be located in the display area DA. The display area DA may overlap at least a part of the image area IA (see FIG. 1A) of the electronic device ELD (see FIG. 1A), and the non-display area NDA may be covered by the bezel area BZA (refer to FIG. 1A) of the electronic device ELD (refer to FIG. 1A). The display area DA and the non-display area NDA of the display panel DP may correspond to the active area AA and the peripheral area NAA of the display device DD shown in FIG. 1B, respectively.

According to one or more embodiments, the display panel DP may include a plurality of pixels PX (hereinafter referred to as pixels), a plurality of signal lines SGL, a scan driving circuit GDC, a driving circuit DIC, and a display pad part DP-PD.

Each of the pixels PX may include a light-emitting element and a plurality of transistors connected thereto. The pixels PX may emit light in response to an applied electrical signal.

The signal lines SGL may include scan lines GL, data lines DL, a power line PL, and a control signal line CSL. The scan lines GL may be respectively connected to a corresponding pixel PX among the pixels PX. The data lines DL may be respectively connected to corresponding pixels PX among the pixels PX. The power line PL may be connected to the pixels PX to provide a power voltage. The control signal line CSL may provide control signals to the scan driving circuit GDC.

The scan driving circuit GDC may be located in the non-display area NDA. The scan driving circuit GDC may generate scan signals and sequentially output the scan signals to the scan lines GL. The scan driving circuit GDC may further output another control signal to the driving circuit of the pixels PX.

The scan driving circuit GDC may include a plurality of thin film transistors formed through the same process as the driving circuit of the pixels PX, for example, a low temperature polycrystalline silicon (LTPS) process or a low temperature polycrystalline oxide (LTPO) process.

In the display panel DP according to one or more embodiments, a portion of the display panel DP may be bent. The display panel DP may include a first non-bending area NBA1, a second non-bending area NBA2 spaced apart from the first non-bending area NBA1 in the second direction DR2, and a bending area BA defined between the first non-bending area NBA1 and the second non-bending area NBA2. The first non-bending area NBA1 may include a display area DA and a part of the non-display area NDA. The non-display area NDA may include a bending area BA and the second non-bending area NBA2.

The bending area BA may be bent along a virtual axis extending in the first direction DR1. When the bending area BA is bent, the second non-bending area NBA2 may face the first non-bending area NBA1. In one or more embodiments, in the display panel DP according to one or more embodiments, the width in the first direction DR1 in the first non-bending area NBA1 may be less than the width in the first direction DR1 in the bending area BA.

The display pad part DP-PD may be located adjacent to an end of the second non-bending area NBA2. The signal lines SGL may extend from the first non-bending area NBA1 to the second non-bending area NBA2 via the bending area BA to be connected to the display pad part DP-PD. The flexible circuit film FCB (see FIG. 1B) may be electrically connected to the display pad part DP-PD. As the flexible circuit film FCB is attached to the display pad part DP-PD through a conductive adhesive film, and the like, the display panel DP and the flexible circuit film FCB may be electrically connected to each other. Meanwhile, the driving circuit DIC may be mounted on the display panel DP and may include a data driving circuit.

FIG. 4B is a circuit diagram illustrating a pixel according to one or more embodiments of the present disclosure.

FIG. 4B shows an equivalent circuit diagram of one of the plurality of pixels PX illustrated in FIG. 4A. Each of the plurality of pixels PX may have the same circuit structure.

Referring to FIG. 4B, the pixel PX is connected to the i-th data line DLi among the data lines DL1-DLm, the j-th initialization scan line GILj among the initialization scan lines GIL1 to GILn, the j-th compensation scan line GCLj among the compensation scan lines GCL1 to GCLn, the j-th write scan line GWLj and the j+1-th write scan line GWLj+1 among the write scan lines GWL1 to GWLn, and the j-th emission control line ELj among the emission control lines EL1 to ELn.

The pixel PX includes a light-emitting element ED and a pixel-driving circuit PDC. The light-emitting element ED may be a light-emitting diode. The light-emitting element ED may be an organic light-emitting diode including an organic light-emitting layer.

The pixel-driving circuit PDC may include first to seventh transistors T1, T2, T3, T4, T5, T6, and T7, and one storage capacitor Cst. The first to seventh transistors T1, T2, T3, T4, T5, T6, and T7 may be respectively referred to as a driving thin film transistor T1, a switching thin film transistor T2, a compensation thin film transistor T3, a first initialization thin film transistor T4, an operation control thin film transistor T5, an emission control thin film transistor T6, and second initialization thin film transistor T7.

Some of the first to seventh transistors T1, T2, T3, T4, T5, T6, and T7 may be P-type transistors, and others may be N-type transistors. For example, the first, second, fifth, sixth, and seventh transistors T1, T2, T5, T6, and T7 may be PMOS transistors, and the third and fourth transistors T3 and T4 may be NMOS transistors.

At least one of the first to seventh transistors T1, T2, T3, T4, T5, T6, and T7 may be a transistor having a low-temperature polycrystalline silicon (LTPS) semiconductor layer, and at least one of the first to seventh transistors T1, T2, T3, T4, T5, T6, and/or T7 may be a transistor having an oxide semiconductor layer.

For example, the first transistor T1, which directly affects the brightness of the display device, is configured to include a semiconductor layer made of polycrystalline silicon having high reliability, thereby realizing a high-resolution display device.

On the other hand, because the oxide semiconductor has high carrier mobility and low leakage current, the voltage drop is not large even if the driving time is long. That is, because the color change of the image according to the voltage drop is not large even during low-frequency driving, low-frequency driving is possible. As such, the oxide semiconductor has the aspect of relatively low leakage current, by employing at least one of the third transistor T3 and/or the fourth transistor T4 connected to the driving gate electrode of the first transistor T1 as an oxide semiconductor, it is possible to reduce or prevent leakage current flowing to the driving gate electrode and reduce power consumption.

The first, second, fifth, sixth, and seventh transistors T1, T2, T5, T6, and T7 may be transistors having a LTPS semiconductor layer, and the third and fourth transistors T3 and T4 may be transistors having an oxide semiconductor layer.

The configuration of the pixel-driving circuit PDC according to the present disclosure is not limited to the embodiments corresponding to FIG. 4B. The pixel-driving circuit PDC illustrated in FIG. 4B is only an example, and the configuration of the pixel-driving circuit PDC may be modified. For example, all of the first to seventh transistors T1, T2, T3, T4, T5, T6, and T7 may be P-type transistors or N-type transistors.

The j-th initialization scan line GILj, the j-th compensation scan line GCLj, the j-th write scan line GWLj, the (j+1)-th write scan line GWLj+1, and the j-th emission control line ELj may respectively transmit the j-th initialization scan signal GIj, the j-th compensation scan signal GCj, the j-th write scan signal GWj, the (j+1)-th write scan signal GWj+1, and the j-th light emission control signal EMj to the pixel PX. The i-th data line DLi transmits the i-th data signal Di to the pixel PX. The i-th data signal Di may have a voltage level corresponding to the image signal input to the display device DD.

The first driving voltage line VL1 and the second driving voltage line VL2 may transmit the first driving voltage ELVDD and the second driving voltage ELVSS to the pixel PX, respectively. Also, the first initialization voltage line VL3 may transmit the first initialization voltage VINT1 to the pixel PX, respectively.

The first transistor T1 is connected between the first driving voltage line VL1 receiving the first driving voltage ELVDD and the light-emitting element ED. The first transistor T1 includes a first electrode connected to the first driving voltage line VL1 through a fifth transistor T5, a second electrode electrically connected to the anode of the light-emitting element ED through the sixth transistor T6, and a third electrode connected to one end of the storage capacitor Cst. The first transistor T1 may receive the i-th data signal Di transmitted from the i-th data line DLi according to the switching operation of the second transistor T2 to supply a driving current to the light-emitting element ED.

The second transistor T2 is connected between the data line DLi and the first electrode of the first transistor T1. The second transistor T2 includes a first electrode connected to the data line DLi, a second electrode connected to the first electrode of the first transistor T1, and a third electrode connected to the j-th write scan line GWLj. The second transistor T2 is turned on according to the write scan signal GWj received through the j-th write scan line GWLj to transmit the i-th data signal Di transmitted from the i-th data line DLi to the first electrode of the first transistor T1.

The third transistor T3 is connected between the second electrode of the first transistor T1 and the first node N1. The third transistor T3 includes a first electrode connected to the third electrode of the first transistor T1, a second electrode connected to the second electrode of the first transistor T1, and a third electrode connected to the j-th compensation scan line GCLj. The third transistor T3 is turned on according to the j-th compensation scan signal GCj received through the j-th compensation scan line GCLj to diode-connect the first transistor T1 by connecting the third electrode and the second electrode of the first transistor T1 to each other.

The fourth transistor T4 is connected between the first initialization voltage line VL3 to which the first initialization voltage VINT1 is applied and the first node N1. The first transistor T1 includes a first electrode connected to the third electrode, a second electrode connected to the first initialization voltage line VL3 to which the first initialization voltage VINT1 is transmitted, and a third electrode connected to the j-th initialization scan line GILj. The fourth transistor T4 is turned on according to the j-th initialization scan signal GIj received through the j-th initialization scan line GILj. The turned-on fourth transistor T4 transmits the first initialization voltage VINT1 to the third electrode of the first transistor T1 to initialize the potential of the third electrode of the first transistor T1 (e.g., the potential of the first node N1).

The fifth transistor T5 includes a first electrode connected to the first driving voltage line VL1, a second electrode connected to the first electrode of the first transistor T1, and a third electrode connected to the j-th emission control line ELj.

The sixth transistor T6 includes a first electrode connected to the second electrode of the first transistor T1, a second electrode connected to the anode of the light-emitting element ED, and a third electrode connected to the j-th emission control line ELj.

The fifth and sixth transistors T5 and T6 are substantially simultaneously turned on according to the j-th emission control signal EMj transmitted through the j-th emission control line ELj. The first driving voltage ELVDD applied through the turned-on fifth transistor T5 may be compensated through the diode-connected first transistor T1 and then transmitted to the light-emitting element ED.

The seventh transistor T7 includes a first electrode connected to the first initialization voltage line VL3 to which the first initialization voltage VINT1 is applied, a second electrode connected to the second electrode of the sixth transistor T6, and a third electrode connected to the (j+1)-th write scan line GWLj+1. The first initialization voltage VINT1 may have a negative constant voltage. For example, the first initialization voltage VINT1 may be a voltage of about −3.5 V, but is not particularly limited thereto.

As described above, one end of the storage capacitor Cst is connected to the third electrode of the first transistor T1, and the other end is connected to the first driving voltage line VL1. The cathode of the light-emitting element ED may be connected to the second driving voltage line VL2 transmitting the second driving voltage ELVSS. The second driving voltage ELVSS may have a lower voltage level than the first driving voltage ELVDD. The second driving voltage ELVSS may have a lower voltage level than the first initialization voltage VINT1.

Figure 5A:
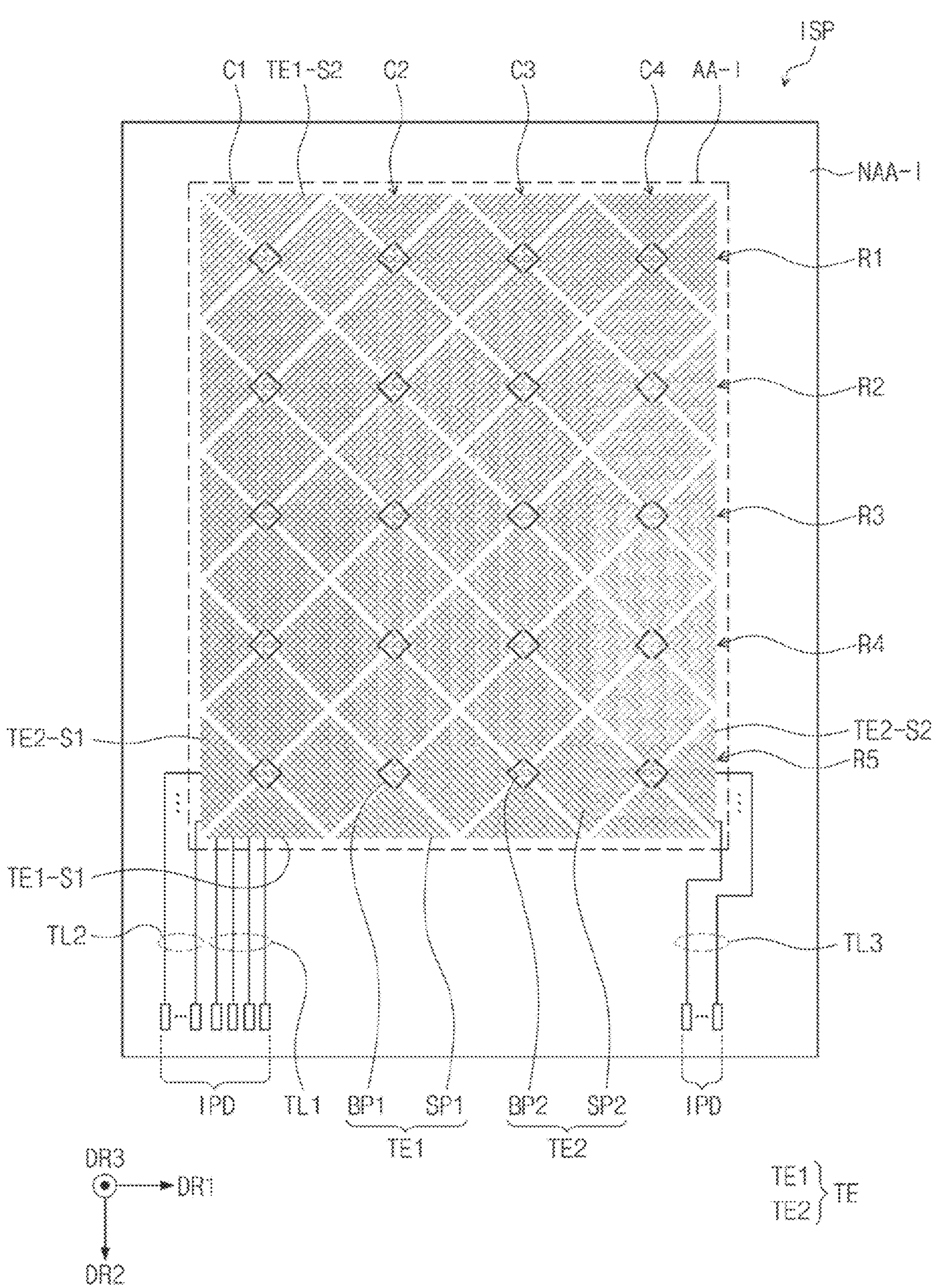
FIG. 5A is a plan view of an input sensor according to one or more embodiments of the present disclosure.
Figure 5B:
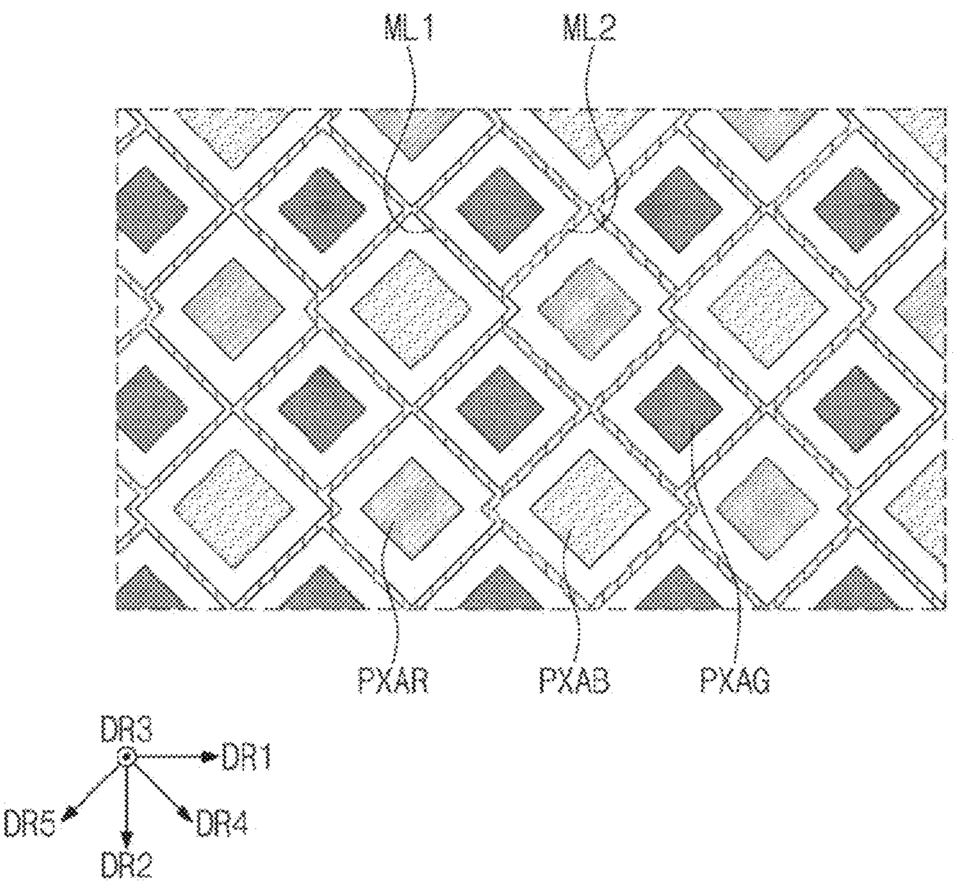
FIG. 5B is a plan view illustrating a partial configuration of a display device according to one or more embodiments.
Figure 5C:
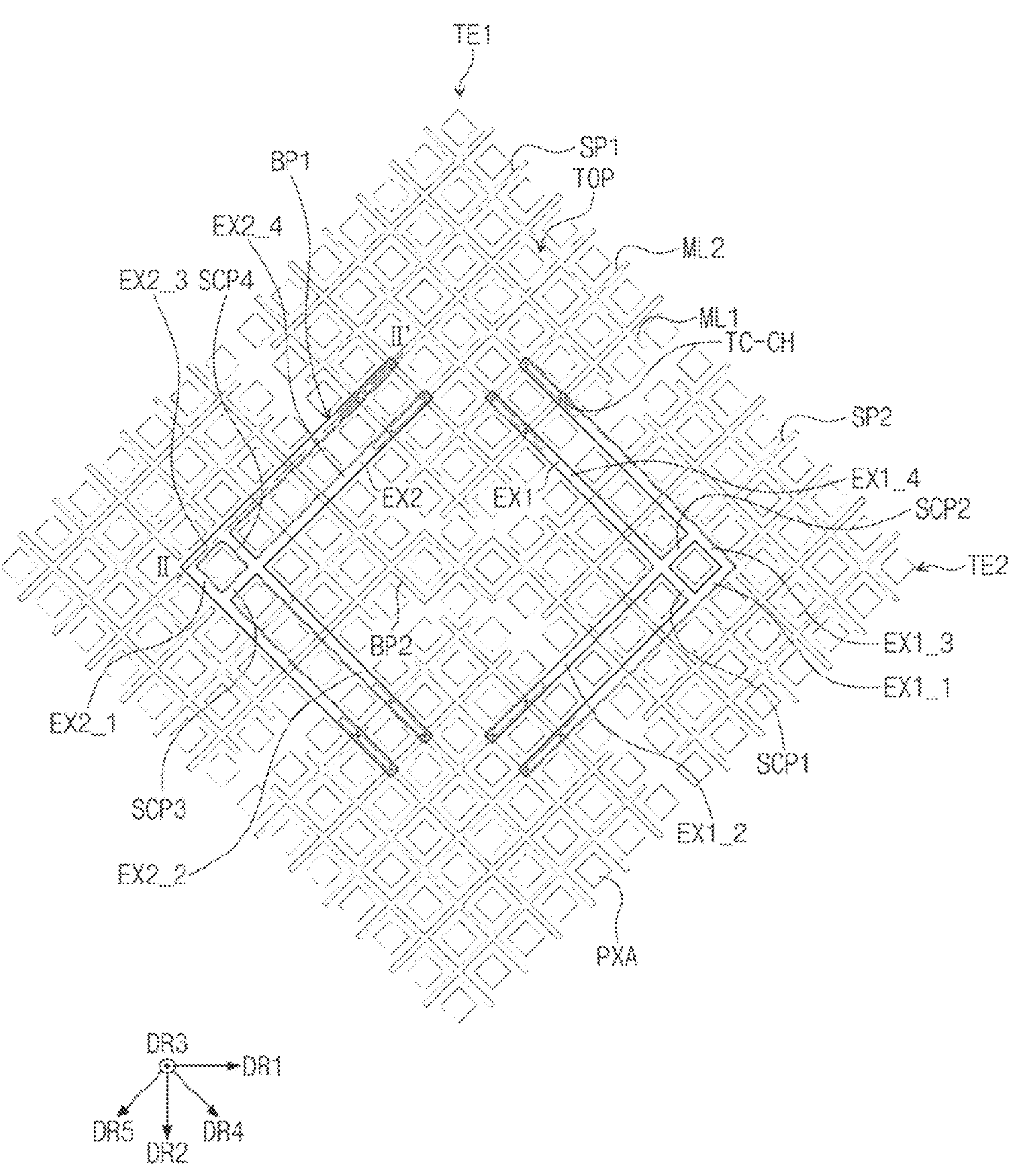
FIG. 5C is a plan view illustrating some configurations of an input sensor according to one or more embodiments of the present disclosure.
Figure 5D:
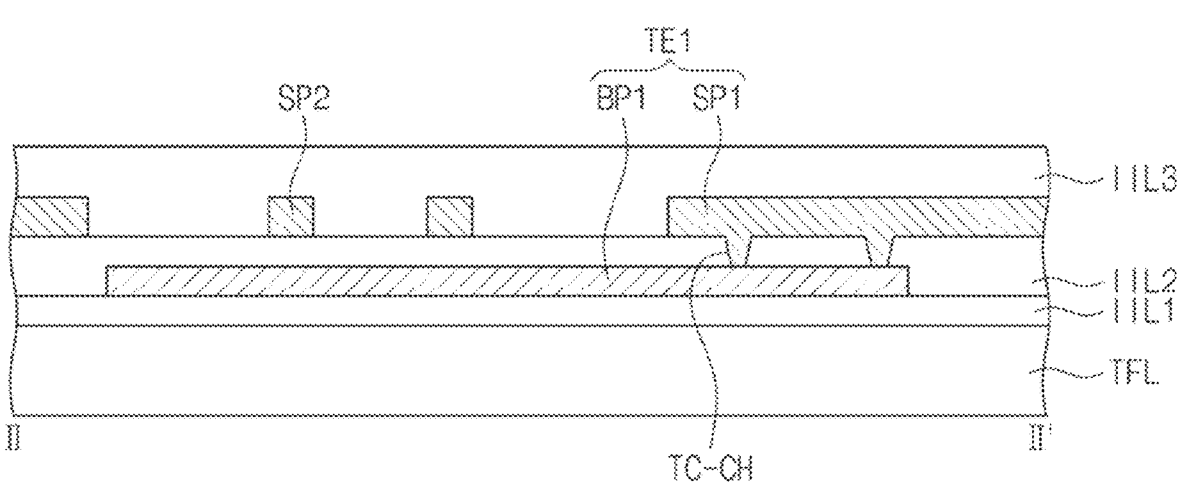
FIG. 5D is a cross-sectional view illustrating some configurations of an input sensor according to one or more embodiments of the present disclosure.
Figure 6:
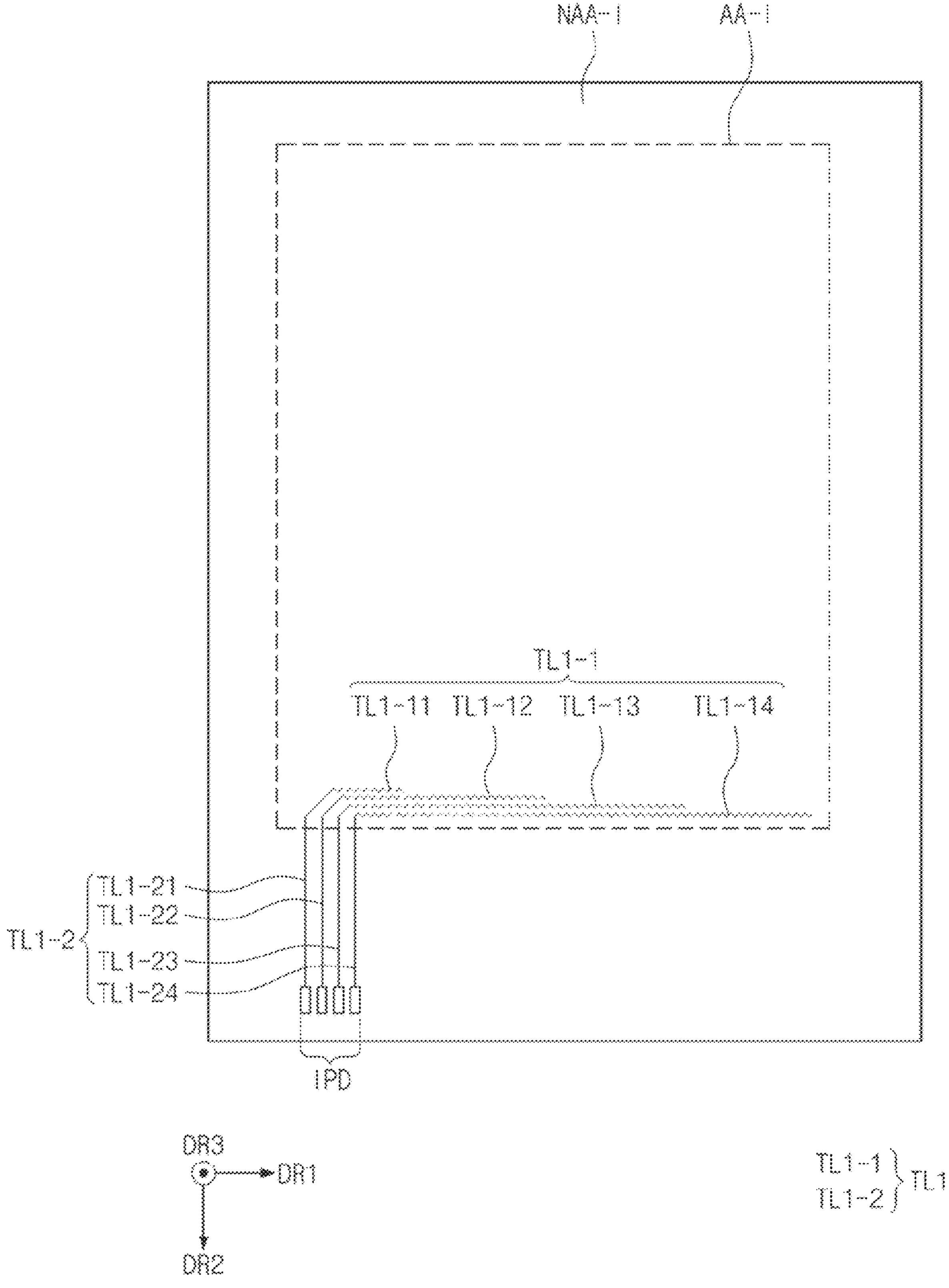
FIG. 6 is a plan view illustrating some configurations of an input sensor according to one or more embodiments of the present disclosure.

FIG. 5A is a plan view of an input sensor according to one or more embodiments of the present disclosure. FIG. 5B is a plan view illustrating a partial configuration of a display device according to one or more embodiments. FIG. 5C is a plan view illustrating some configurations of an input sensor according to one or more embodiments of the present disclosure. FIG. 5D is a cross-sectional view illustrating some configurations of an input sensor according to one or more embodiments of the present disclosure. Portions of the display area DA (see FIG. 4A) of the display panel DP (see FIG. 4A) and the active area AA-I of the input sensor ISP (see FIG. 5A) are shown in FIG. 5B. FIG. 5C is an enlarged view of two adjacent first detection patterns and two adjacent second detection patterns illustrated in FIG. 5A. FIG. 5D is a cross-sectional view corresponding to the II-II' cut line shown in FIG. 5C. FIG. 6 is a plan view illustrating some configurations of an input sensor according to one or more embodiments of the present disclosure. FIG. 6 schematically shows the arrangement of the first trace line in the input sensor according to one or more embodiments of the present disclosure. Hereinafter, an input sensor ISP will be described with additional reference to FIG. 4A.

Referring to FIG. 5A, the input sensor ISP may be divided into an active area AA-I, and a peripheral area NAA-I adjacent to the active area AA-I. The active area AA-I and the peripheral area NAA-I of the input sensor ISP may correspond to the display area DA and the non-display area NDA of the display panel DP, respectively. That is, the active area AA-I of the input sensor ISP may be an area overlapping the display area DA in which the light-emitting elements of each of the plurality of pixels PX are located.

According to one or more embodiments, the input sensor ISP may include a plurality of detection electrodes TE, a plurality of trace lines TL1, TL2, and TL3 respectively connected to the detection electrodes TE, and an input pad part IPD including a plurality of detection pads. One end of the plurality of trace lines TL1, TL2, TL3 may be connected to the plurality of detection electrodes TE1 and TE2, and the other end may be connected to a plurality of detection pads located on the input pad part IPD. Meanwhile, each of the plurality of trace lines TL1, TL2, and TL3 illustrated in FIG. 5A may be a part of the trace line. Each of the plurality of trace lines TL1, TL2, TL3 shown in FIG. 5A corresponds to a second part of a trace line to be described later, and the remaining partial cases will be described in more detail in the description of FIGS. 6, 8, and 9.

The plurality of detection electrodes TE may include a first detection electrode TE1 and a second detection electrode TE2.

The first detection electrode TE1 may extend in the second direction DR2, may be provided in a plurality of columns, and may be arranged along the first direction DR1. The first detection electrode TE1 may include first detection patterns SP1 and first conductive patterns BP1. The first detection patterns SP1 may extend along the second direction DR2. The at least one first conductive pattern BP1 may be connected to two adjacent first detection patterns SP1, and may electrically connect two adjacent first detection patterns SP1.

Meanwhile, in one or more embodiments, the first detection electrode TE1 may include a plurality of column detection electrodes C1, C2, C3, and C4. The first detection electrode TE1 may include a first column detection electrode C1, a second column detection electrode C2, a third column detection electrode C3, and a fourth column detection electrode C4, which extend along the second direction DR2 and are spaced apart from each other along the first direction DR1. The first column detection electrode C1, the second column detection electrode C2, the third column detection electrode C3, and the fourth column detection electrode C4 may be detection electrodes sequentially located along the first direction DR1. Meanwhile, in the present specification, the plurality of column detection electrodes C1, C2, C3, and C4 include four column detection electrodes by way of example, but the present disclosure is not limited thereto, and the plurality of column detection electrodes C1, C2, C3, and C4 may include three or fewer, or five or more column detection electrodes. The first detection electrode TE1 may include a first side TE1-S1 and a second side TE1-S2 spaced apart from each other in the second direction DR2.

The second detection electrode TE2 may extend in the first direction DR1, may be provided in a plurality of rows, and may be arranged in the second direction DR2. The second detection electrode TE2 may include second detection patterns SP2 and second conductive patterns BP2. The second detection patterns SP2 may extend along the first direction DR1. According to one or more embodiments, the second detection patterns SP2 and the second conductive patterns BP2 may be integrally shaped patterns patterned by the same process.

Meanwhile, in one or more embodiments, the second detection electrode TE2 may include a plurality of row detection electrodes R1, R2, R3, R4, and R5. The first detection electrode TE1 may include a first row detection electrode R1, a second row detection electrode R2, a third row detection electrode R3, a fourth row detection electrode R4, and a fifth row detection electrode R5, which extend along the first direction DR1, and which are spaced apart from each other along the second direction DR2. The first row detection electrode R1, the second row detection electrode R2, the third row detection electrode R3, the fourth row detection electrode R4, and the fifth row detection electrode R5 may be detection electrodes sequentially located along the second direction DR2. Meanwhile, in the present specification, the plurality of row detection electrodes R1, R2, R3, R4, and R5 include five row detection electrodes by way of example, but the present disclosure is not limited thereto, and the plurality of row detection electrodes R1, R2, R3, R4, and R5 may include 4 or fewer or 6 or more row detection electrodes. The second detection electrode TE2 may include a third side TE2-S1 and a fourth side TE2-S2 spaced apart from each other in the first direction DR1.

As shown in FIG. 5A, each of the first detection electrode TE1 and the second detection electrode TE2 may include a plurality of conductive lines crossing each other, and may have a mesh shape in which a plurality of opening parts are defined. Meanwhile, the mesh shape of the detection electrode TE will be described later in more detail in the description of FIG. 7.

According to one or more embodiments, each of the first detection patterns SP1, the second detection patterns SP2, the first conductive pattern BP1, and the second conductive pattern BP2 may be included in the first detection conductive layer ICL1 and/or the second detection conductive layer ICL2 described with reference to FIG. 3. For example, the first detection patterns SP1, the second detection patterns SP2, and the first conductive pattern BP1 may be included in the second detection conductive layer ICL2 described with reference to FIG. 3, and the second conductive pattern BP2 may be included in the first detection conductive layer ICL1 described with reference to FIG. 3.

The plurality of trace lines TL1, TL2, and TL3 may include first trace lines TL1, second trace lines TL2, and third trace lines TL3. As described above, each of the plurality of trace lines TL1, TL2, and TL3 illustrated in FIG. 5A may be a part of the trace line. In one or more embodiments, part of the first trace lines TL1 illustrated in FIG. 5A may be located in the peripheral area NAA-I, and the remaining part of the first trace lines TL1 may be located in the active area AA-I. Similarly, part of the second trace lines TL2 shown in FIG. 5A may be located in the peripheral area NAA-I, and the remaining part of the second trace lines TL2 may be located in the active area AA-I, and part of the third trace lines TL3 shown in FIG. 5A may be located in the peripheral area NAA-I, and the remaining part of the third trace lines TL3 may be located in the active area AA-I.

Meanwhile, the remaining part of the plurality of trace lines described above may be located to replace a part of the detection electrode TE illustrated in FIG. 5A. The remaining part of the first trace lines TL1 may be located to replace a part of the first detection patterns SP1 among the first detection electrodes TE1 illustrated in FIG. 5A. The remaining parts of the second and third trace lines TL2 and TL3 may be located to replace a part of the second detection patterns SP2 among the second detection electrodes TE2 illustrated in FIG. 5A.

Referring to FIGS. 4A, 5A, and 5B together, a plurality of emission areas PXAR, PXAG, and PXAB corresponding to each pixel may be included in the display area DA, and the emission areas PXAR, PXAG, and PXAB may include a red emission area PXAR, a green emission area PXAG, and a blue emission area PXAB. Each of the red emission area PXAR, the green emission area PXAG, and the blue emission area PXAB may be arranged in a PENTILE™ structure (e.g., a RGBG matrix structure, a PENTILE™ matrix structure, a PENTILE™ structure, or an RGBG structure, PENTILE™ being a registered trademark of Samsung Display Co., Ltd., Republic of Korea). The PENTILE™ structure may refer to the structure shown in FIG. 5B. However, the arrangement structure of the red emission area PXAR, the green emission area PXAG, and the blue emission area PXAB is not limited to the embodiments corresponding to FIG. 5B.

Each of the first detection electrode TE1 and the second detection electrode TE2 included in the input sensor ISP may include a plurality of conductive lines crossing each other, and may have a mesh shape in which a plurality of opening parts are defined. For example, each of the first detection electrode TE1 and the second detection electrode TE2 may have a mesh-like structure including a first mesh line ML1 extending in a first diagonal direction DR4 that is a direction between the first and second directions DR1 and DR2, and a second mesh line ML2 extending in a second diagonal direction DR5 intersecting or crossing the first diagonal direction DR4.

The plurality of emission areas PXAR, PXAG, and PXAB may be located in a mesh opening formed by a first mesh line ML1 and a second mesh line ML2 crossing each other. Each of the red emission area PXAR, the green emission area PXAG, and the blue emission area PXAB may be located in a respective mesh opening formed by the first mesh line ML1 and the second mesh line ML2 crossing each other.

Referring to FIGS. 5A and 5C together, the first detection pattern SP1 and the second detection pattern SP2 may have a mesh shape. Each of the first and second detection patterns SP1 and SP2 may include a plurality of first mesh lines ML1 extending in a first diagonal direction DR4, and a plurality of second mesh lines ML2 extending in a second diagonal direction DR5, to thereby have a mesh shape.

The first mesh line ML1 of each of the first and second detection patterns SP1 and SP2 may cross the second mesh line ML2 of each of the first and second detection patterns SP1 and SP2, and may be formed integrally therewith. The rhombus-shaped touch opening parts TOP may be defined by the first mesh line ML1 and the second mesh line ML2.

In a plan view, the emission areas PXA may be located in the touch opening parts TOP. The above-described light-emitting elements ED (refer to FIG. 3) may be located in the emission areas PXA. Each of the emission areas PXA may be any one of a red emission area PXAR, a green emission area PXAG, and a blue emission area PXAB illustrated in FIG. 5B. The first and second detection patterns SP1 and SP2 may define emission areas PXA. Because the emission areas PXA are located in the touch opening parts TOP, the light generated in the emission areas PXA is not affected (e.g., impeded) by the first and second detection patterns SP1 and SP2, and may be emitted normally.

The first conductive pattern BP1 may extend so as not to overlap the second conductive pattern BP2 to connect respective portions of the first detection pattern SP1. The first conductive pattern BP1 may be connected to the first detection pattern SP1 through the plurality of contact holes TC-CH. The first conductive pattern BP1 may extend toward the first detection pattern SP1 via areas overlapping the second detection pattern SP2.

The second conductive pattern BP2 may be located between respective portions of the first detection pattern SP1, and may extend from the second detection pattern SP2. The second detection pattern SP2 and the second conductive pattern BP2 may be integrally formed. The second conductive pattern BP2 may have a mesh shape. The second conductive pattern BP2, the first detection pattern SP1, and the second detection pattern SP2 may be located on the same layer, and may be formed by being substantially simultaneously patterned with the same material.

The first conductive pattern BP1 may include a first extension part EX1, and a second extension part EX2 having a shape that is symmetrical to the first extension part EX1. The second conductive pattern BP2 may be located between the first extension part EX1 and the second extension part EX2 (e.g., in plan view).

The first extension part EX1 may extend through an area overlapping one of the second detection patterns among the second detection patterns SP2, and may be connected to the first detection pattern SP1. The second extension part EX2 may extend through an area overlapping another second detection pattern of the second detection patterns SP2 and may be connected to the first detection pattern SP1.

Hereinafter, the first detection pattern SP1 is defined as an upper first detection pattern SP1 and a lower first detection pattern SP1 according to a relative arrangement position (e.g., with respect to the second direction DR2). In addition, the second detection pattern SP2 is defined as a left second detection pattern SP2 and a right second detection pattern SP2 according to a relative arrangement position (e.g., with respect to the first direction DR1).

Portions (e.g., predetermined portions) of the first and second extension parts EX1 and EX2 adjacent to one side of the first and second extension parts EX1 and EX2 may be connected to the lower first detection pattern SP1 through the plurality of contact holes TC-CH. Other portions (e.g., predetermined portions) of the first and second extension parts EX1 and EX2 adjacent to the other sides of the first and second extension parts EX1 and EX2 may be connected to the upper first detection pattern SP1 through the plurality of contact holes TC-CH.

The first extension part EX1 may include a first sub extension part EX1_1 and a second sub extension part EX1_2 extended in the second diagonal direction DR5, a third sub extension part EX1_3 and a fourth sub extension part EX1_4 extending in the first diagonal direction DR4, a first sub conductive pattern SCP1 extending in the first diagonal direction DR4, and a second sub conductive pattern SCP2 extending in the second diagonal direction DR5.

Portions (e.g., predetermined portions) of the first and second sub extension parts EX1_1 and EX1_2 adjacent to one side of the first and second sub extension parts EX1_1 and EX1_2 may be connected to the lower first detection pattern SP1 through the plurality of contact holes TC-CH. Portions (e.g., predetermined portions) of the third and fourth sub extension parts EX1_3 and EX1_4 adjacent to one side of the third and fourth sub extension parts EX1_3 and EX1_4 may be connected to the upper first detection pattern SP1 through the plurality of contact holes TC-CH.

The other side of the first sub extension part EX1_1 may extend from the other side of the third sub extension part EX1_3, and the other side of the second sub extension part EX1_2 may extend from the other side of the fourth sub extension part EX1_4. The first sub conductive pattern SCP1 may extend in the first diagonal direction DR4 from the other side of the fourth sub extension part EX1_4, and may extend toward the first sub-extension part EX1_1. The second sub conductive pattern SCP2 may extend in the second diagonal direction DR5 from the other side of the second sub extension part EX1_2 and may extend toward the third sub extension part EX1_3.

The first sub extension part EX1_1, the second sub extension part EX1_2, the third sub extension part EX1_3, the fourth sub extension part EX1_4, the first sub conductive pattern SCP1, and the second sub conductive pattern SCP2 may be formed integrally.

The first and second sub extension parts EX1_1 and EX1_2 may extend to cross a number (e.g., predetermined number) of second mesh lines ML2 adjacent to the lower first detection pattern SP1 among the second mesh lines ML2 of the right second detection pattern SP2. The first mesh line ML1 of the right second detection pattern SP2 may not be located in some areas overlapping the first and second sub extension parts EX1_1 and EX1_2 and the second sub conductive pattern SCP2.

The third and fourth sub extension parts EX1_3 and EX1_4 may extend to cross a number (e.g., predetermined number) of first mesh lines ML1 adjacent to the upper first detection pattern SP1 among the first mesh lines ML1 of the right second detection pattern SP2. The second mesh line ML2 of the right second detection pattern SP2 may not be located in some areas overlapping the third and fourth sub extension parts EX1_3 and EX1_4 and the first sub conductive pattern SCP1.

The second extension part EX2 may include a fifth sub extension part EX2_1 and a sixth sub extension part EX2_2 extending in the first diagonal direction DR4, a seventh sub extension part EX2_3 and an eighth sub extension part EX2_4 extending in the second diagonal direction DR5, a third sub-conductive pattern SCP3 extending in the second diagonal direction DR5, and a fourth sub conductive pattern SCP4 extending in the first diagonal direction DR4.

The left second detection pattern SP2 may have a structure that is substantially symmetrical to the right second detection pattern SP2, and the second extension part EX2 may have a structure that is substantially symmetrical to the first extension part EX1. That is, the same description as that of the first to fourth sub extension parts EX1_1, EX1_2, EX1_3, and EX1_4 may be generally applied to the fifth to eighth sub extension parts EX2_1, EX2_2, EX2_3, and EX2_4, and the same description of the first and second sub conductive patterns SCP1 and SCP2 may be generally applied to the third and fourth sub conductive patterns SCP3 and SCP4.

Referring to FIGS. 5A, 5C, and 5D together, a first detection insulating layer IIL1 may be located on the upper insulating layer TFL. The first detection insulating layer IIL1 may include an inorganic insulating layer. At least one first detection insulating layer IIL1 may be provided on the upper insulating layer TFL.

A first conductive pattern BP1 may be located on the first detection insulating layer IIL1. A second detection insulating layer IIL2 may be located on the first conductive pattern BP1 and the first detection insulating layer IIL1. The second detection insulating layer IIL2 may be located on the first detection insulating layer IIL1 to cover the first conductive pattern BP1. The second detection insulating layer IIL2 may include an inorganic insulating layer or an organic insulating layer.

A first detection pattern SP1 and a second detection pattern SP2 may be located on the second detection insulating layer IIL2. The second conductive pattern BP2 integrally formed with the second detection pattern SP2 may also be located on the second detection insulating layer IIL2. The first conductive pattern BP1 may be connected to the first detection pattern SP1 through one or more contact holes TC-CH defined in the second detection insulating layer IIL2.

A third detection insulating layer IIL3 may be located on the first and second detection patterns SP1 and SP2 and the second detection insulating layer IIL2. The third detection insulating layer IIL3 may be located on the second detection insulating layer IIL2 to cover the first and second detection patterns SP1 and SP2. The third detection insulating layer IIL3 may include an organic insulating layer.

Referring to FIGS. 5A and 6, the first trace lines TL1 may be located on the first side TE1-S1 of the first detection electrode TE1. Each of the first trace lines TL1 includes a first portion TL1-1 and a second portion TL1-2.

The first portion TL1-1 is a portion located within the active area AA-I, and at least a portion thereof extends in the first direction DR1. The first portion TL1-1 includes a plurality of mesh lines. That is, the first portion TL1-1 may have a plurality of mesh line shapes extending in the first direction DR1.

The second portion TL1-2 is electrically connected to the first portion TL1-1, and extends in the second direction DR2. The second portion TL1-2 is a portion located in the peripheral area NAA-I. One end of the second portion TL1-2 may be connected to the first portion TL1-1, and the other end may be connected to a plurality of detection pads located on the input pad part IPD.

The first portion TL1-1 includes a plurality of row mesh lines TL1-11, TL1-12, TL1-13, and TL1-14 each extending in the first direction DR1. The plurality of row mesh lines TL1-11, TL1-12, TL1-13, and TL1-14 include a first row mesh line TL1-11, a second row mesh line TL1-12, and a third row mesh line. TL1-13, and a fourth row mesh line TL1-14. Each of the first row mesh line TL1-11, the second row mesh line TL1-12, the third row mesh line TL1-13, and the fourth row mesh line TL1-14 may have at least a part extending in one direction DR1, and may be spaced apart from each other in the second direction DR2.

The first portion TL1-1 is located in the active area AA-I, and may be electrically connected to some of the plurality of detection electrodes TE. The first portion TL1-1 may be electrically connected to the first detection patterns SP1 of the first detection electrode TE1. In one or more embodiments, each of the plurality of row mesh lines TL1-11, TL1-12, TL1-13, and TL1-14 included in the first portion TL1-1 may be electrically connected to the first detection patterns SP1. The plurality of row mesh lines TL1-11, TL1-12, TL1-13, and TL1-14 may be electrically connected to the plurality of column detection electrodes C1, C2, C3, and C4, respectively, included in the first detection electrode TE1. In one or more embodiments, the first row mesh line TL1-11 may be connected to the first column detection electrode C1, the second row mesh line TL1-12 may be connected to the second column detection electrode C2, the third row mesh line TL1-13 may be connected to the third column detection electrode C3, and the fourth row mesh line TL1-14 may be connected to the fourth column detection electrode C4. As the plurality of row mesh lines TL1-11, TL1-12, TL1-13, TL1-14 are respectively connected to a plurality of different column detection electrodes C1, C2, C3, and C4, the plurality of row mesh lines TL1-11, TL1-12, TL1-13, and TL1-14 may have different lengths extending along the first direction DR1. As shown in FIG. 6, the second row mesh line TL1-12 may have a longer extension length in the first direction DR1 than the first row mesh line TL1-11. The third row mesh line TL1-13 may have a longer extension length in the first direction DR1 than the first row mesh line TL1-11 and the second row mesh line TL1-12. The fourth row mesh line TL1-4 may have a longer extension length in the first direction DR1 than the first row mesh line TL1-11, the second row mesh line TL1-12, and the third row mesh line TL1-13.

The second portion TL1-2 may include a plurality of column wirings TL1-21, TL1-22, TL1-23, and TL1-24 that are respectively electrically connected to a plurality of row mesh lines TL1-11, TL1-12, TL1-13, and TL1-14 included in the first portion TL1-1, and may extend in the second direction DR2. The plurality of column wirings TL1-21, TL1-22, TL1-23, and TL1-24 may include a first column wiring TL1-21 connected to the first row mesh line TL1-11, a second column wiring TL1-22 connected to the second row mesh line TL1-12, a third column wiring TL1-23 connected to the third row mesh line TL1-13, and a fourth column wiring TL1-24 connected to the fourth row mesh line TL1-14. Each of the first column wiring TL1-21, the second column wiring TL1-22, the third column wiring TL1-23, and the fourth column wiring TL1-24 may extend along the second direction DR2, and may be spaced apart from each other along the first direction DR1.

The second portion TL1-2 may be located to overlap any one of the plurality of column detection electrodes C1, C2, C3, and C4 included in the first detection electrode TE1. In one or more embodiments, the second portion TL1-2 may be located to overlap the first column detection electrode C1 in the second direction DR2. The second portion TL1-2 might not overlap other column detection electrodes along the second direction DR2. That is, the second portion TL1-2 may overlap the first column detection electrode C1 along the second direction DR2 (e.g., may be aligned in the second direction DR2), while not overlapping the second column detection electrode C2, the third column detection electrode C3, and the fourth column detection electrode C4 (e.g., while not being aligned with the second column detection electrode C2, the third column detection electrode C3, and the fourth column detection electrode C4 in the second direction).

Figure 7:
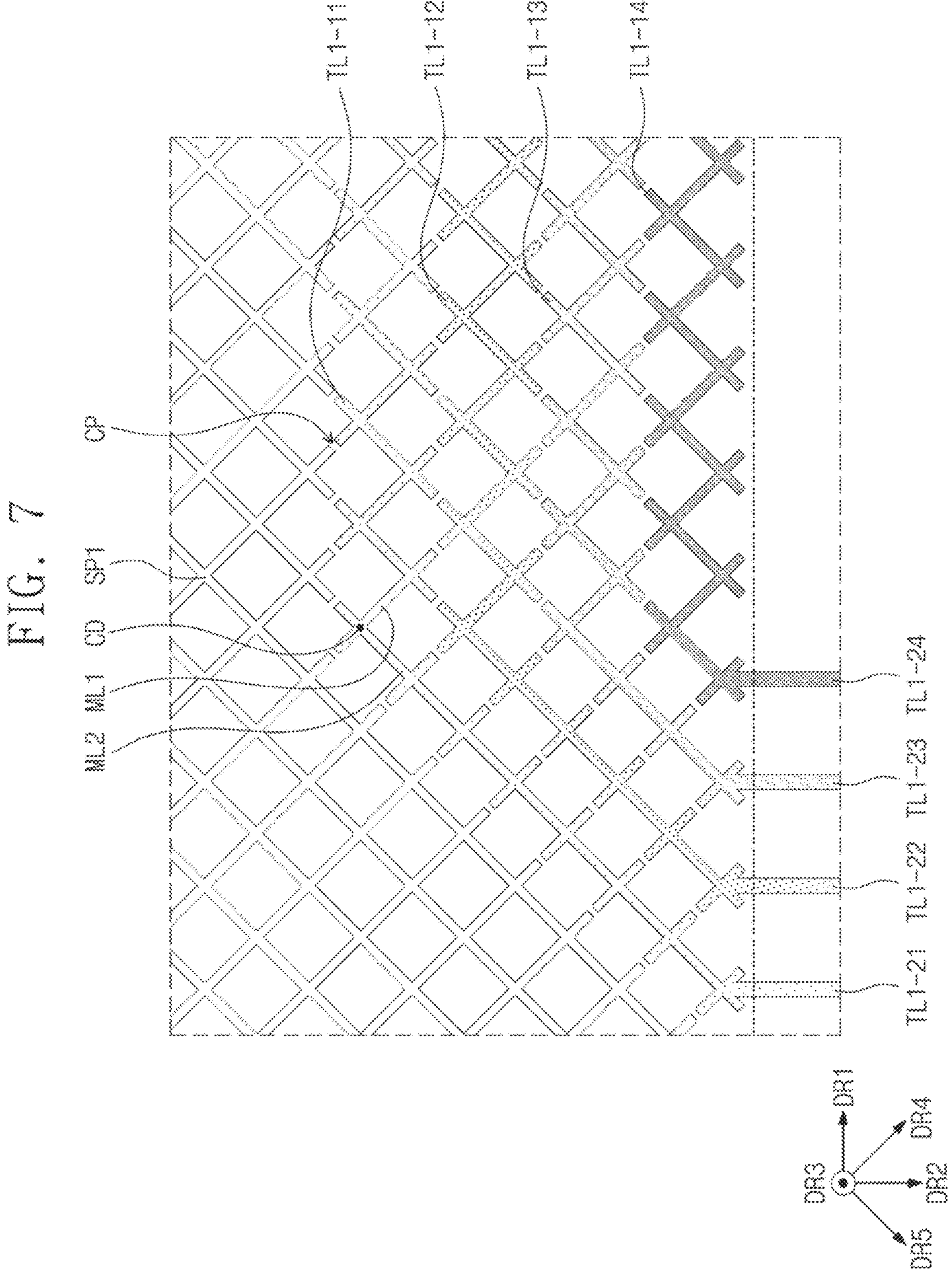
FIG. 7 is a plan view illustrating a part of an input sensor according to one or more embodiments of the present disclosure.

FIG. 7 is a plan view illustrating a part of an input sensor according to one or more embodiments of the present disclosure. In the configuration of the input sensor shown in FIGS. 5A and 6, a portion where the first portion and the second portion of the first trace line are connected, and a portion of the first detection pattern included in the first column detection electrode adjacent thereto, are enlarged and shown in FIG. 7.

Referring to FIGS. 5A to 7, each of the plurality of row mesh lines TL1-11, TL1-12, TL1-13, and TL1-14 included in the first portion TL1-1 may have a mesh shape. As shown in FIG. 7, each of the plurality of row mesh lines TL1-11, TL1-12, TL1-13, and TL1-14 may include a first mesh line ML1 extending in a first diagonal direction DR4 that is a direction between the first direction DR1 and the second direction DR2, and a second mesh line ML2 extending in a second diagonal direction DR5 crossing the first diagonal direction DR4. The first mesh line ML1 and the second mesh line ML2 may have a shape in which they cross each other. The intersection point CD at which the first mesh line ML1 and the second mesh line ML2 cross each other may be provided as, or may be referred to as, part of an intersection point row arranged along the first direction DR1.

The plurality of column wirings TL1-21, TL1-22, TL1-23, and TL1-24 may include a first column wiring TL1-21 connected to the first row mesh line TL1-11, a second column wiring TL1-22 connected to the second row mesh line TL1-12, a third column wiring TL1-23 connected to the third row mesh line TL1-13, and a fourth column wiring TL1-24 connected to the fourth row mesh line TL1-14. Each of the first column wiring TL1-21, the second column wiring TL1-22, the third column wiring TL1-23, and the fourth column wiring TL1-24 may extend along the second direction DR2 and may be spaced apart from each other along the first direction DR1.

Each of the plurality of row mesh lines TL1-11, TL1-12, TL1-13, and TL1-14 may extend in the first direction DR1 and may be spaced apart from each other in the second direction DR2. Each of the plurality of row mesh lines TL1-11, TL1-12, TL1-13, and TL1-14 may have a mesh structure including a first mesh line ML1 and a second mesh line ML2, and each of the plurality of row mesh lines TL1-11, TL1-12, TL1-13, and TL1-14 may have a shape in which portions of the mesh lines are cut via the cutting part CP. Accordingly, each of the plurality of row mesh lines TL1-11, TL1-12, TL1-13, and TL1-14 may be electrically insulated from each other.

Meanwhile, a portion of the first detection electrode TE1 may be located adjacent to the plurality of row mesh lines TL1-11, TL1-12, TL1-13, and TL1-14. The first detection pattern SP1 included in the first detection electrode TE1 may have a shape in which the first mesh line ML1 and the second mesh line ML2 cross each other like a plurality of row mesh lines TL1-11, TL1-12, TL1-13, and TL1-14. In one or more embodiments, as shown in FIG. 7, the first detection pattern SP1 may be located adjacent to the first row mesh line TL1-11 located at the top of the plurality of row mesh lines TL1-11, TL1-12, TL1-13, and TL1-14. A cutting part CP may be defined between the first row mesh line TL1-11 and the first detection pattern SP1 to be separated from each other. In one or more other embodiments, the cutting part CP is not defined in a portion between the adjacent first row mesh lines TL1-11 and the first detection pattern SP1, such that the first row mesh line TL1-11 and the first detection pattern SP1 may be electrically connected to each other.

Meanwhile, in FIG. 7, the shape of the first detection pattern SP1 included in the first column detection electrode C1 and the plurality of row mesh lines TL1-11, TL1-12, TL1-13, and TL1-14 adjacent thereto is shown, and in other column detection electrodes, the arrangement relationship of the first detection pattern SP1 and the plurality of row mesh lines TL1-11, TL1-12, TL1-13, and TL1-14 adjacent thereto may be different.

For example, as shown in FIGS. 5A and 6, because the first row mesh line TL1-11 does not extend to the position of the second column detection electrode C2, among the plurality of row mesh lines TL1-11, TL1-12, TL1-13, and TL1-14, a second row mesh line TL1-12 may be located adjacent to the first detection pattern SP1 included in the second column detection electrode C2. The cutting part CP is defined between the first detection pattern SP1 and the second row mesh line TL1-12 included in the second column detection electrode C2, and has a shape such that they are separated from each other, but the cutting part CP is not defined in a portion between the second row mesh line TL1-12 and the first detection pattern SP1, such that the second row mesh line TL1-12 and the first detection pattern SP1 may be electrically connected to each other. In addition, as shown in FIGS. 5A and 6, because the first row mesh line TL1-11 and the second row mesh line TL1-12 do not extend to the position of the third column detection electrode C3, a third row mesh line TL1-13 among the plurality of row mesh lines TL1-11, TL1-12, TL1-13, and TL1-14 may be located adjacent to the first detection pattern SP1 included in the third column detection electrode C3. The cutting part CP is defined between the first detection pattern SP1 included in the third column detection electrode C3 and the third row mesh line TL1-13 to have a shape that is cut from each other, but the cutting part CP is not defined in a portion of the third row mesh lines TL1-13 and the first detection pattern SP1, such that the third row mesh line TL1-13 and the first detection pattern SP1 may be electrically connected to each other. In addition, as shown in FIGS. 5A and 6, because the first row mesh line TL1-11, the second row mesh line TL1-12, and the third row mesh line TL1-13 do not extend to the position of the fourth column detection electrode C4, a fourth row mesh line TL1-14 among the plurality of row mesh lines TL1-11, TL1-12, TL1-13, and TL1-14 may be located adjacent to the first detection pattern SP1 included in the fourth column detection electrode C4. The cutting part CP is defined between the first detection pattern SP1 and the fourth row mesh line TL1-14 included in the fourth column detection electrode C4 and has a cut shape, but the cutting part CP is not defined in a portion between the fourth row mesh line TL1-14 and the first detection pattern SP1, such that the fourth row mesh line TL1-14 and the first detection pattern SP1 may be electrically connected to each other.

In the input sensor included in the display device of one or more embodiments, a first portion, which is a part of a plurality of first trace lines, is located in the active area, and the first portion located in the active area has a mesh line shape including mesh lines like a plurality of detection electrodes. Also, the first portion and the second portion connected to the detection pad of the input pad part may be located to overlap only one column detection electrode among the plurality of detection electrodes, and not to overlap the other column detection electrodes. Accordingly, an area of a portion in which the plurality of first trace lines are located in the peripheral area is reduced or minimized, and thus a dead space of the display device including the input sensor may be reduced or minimized. In addition, the first portion of the first trace line having a mesh shape may be formed in the same process as the detection pattern, such that it is possible to form an integrated detection electrode and trace line without additional processing, and accordingly, it is possible to provide an input sensor and a display device with a reduced or minimized dead space through a simplified process.

Figure 8:
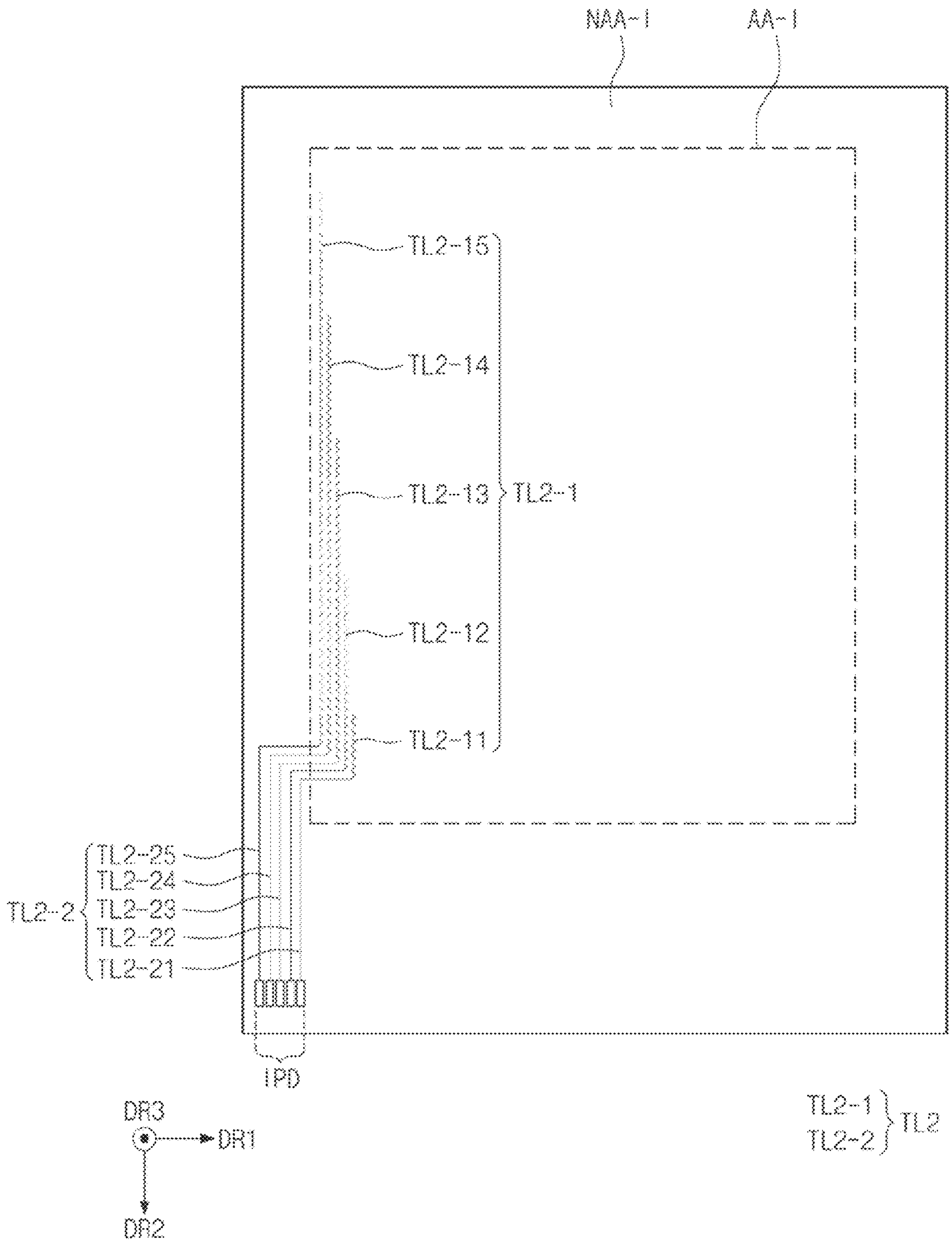
FIG. 8 is a plan view illustrating some configurations of an input sensor according to one or more embodiments of the present disclosure.

FIG. 8 is a plan view illustrating some configurations of an input sensor according to one or more embodiments of the present disclosure. FIG. 8 schematically shows the arrangement of the second trace line in the input sensor according to one or more embodiments of the present disclosure.

Referring to FIGS. 5A, 6, and 8, the second trace lines TL2 may be located on the third side TE2-S1 of the second detection electrode TE2. Each of the second trace lines TL2 may include a third portion TL2-1 and a fourth portion TL2-2.

The third portion TL2-1 is a portion located within the active area AA-I, and at least a portion of the third portion TL2-1 may extend in the second direction DR2. The third portion TL2-1 may include a plurality of mesh lines. That is, the third portion TL2-1 may have a plurality of mesh line shapes extending in the second direction DR2. Meanwhile, the shape of the mesh line described with reference to FIG. 7 may be applied to the shape of the mesh line of the third portion TL2-1. That is, the third portion TL2-1 may include the first mesh line ML1 and the second mesh line ML2, as shown in FIG. 7.

The fourth portion TL2-2 may be electrically connected to the third portion TL2-1, and at least a portion thereof extends in the first direction DR1. The fourth portion TL2-2 may be a portion located in the peripheral area NAA-I. One end of the fourth portion TL2-2 may be connected to the third portion TL2-1, and the other end may be connected to a plurality of detection pads located on the input pad part IPD.

The third portion TL2-1 includes a plurality of column mesh lines TL2-11, TL2-12, TL2-13, and TL2-14 each extending in the second direction DR2. The plurality of column mesh lines TL2-11, TL2-12, TL2-13, TL2-14, and TL2-15 may include a first column mesh line TL2-11, a second column mesh line TL2-12, a third column mesh line TL2-13, a fourth column mesh line TL2-14, and a fifth column mesh line TL2-15. The first column mesh line TL2-11, the second column mesh line TL2-12, the third column mesh line TL2-13, the fourth column mesh line TL2-14, and the fifth column mesh line TL2-15 each may have at least a portion extending in the second direction DR2, and may be spaced apart from each other in the first direction DR1.

The third portion TL2-1 is located in the active area AA-I, and may be electrically connected to some of the plurality of detection electrodes TE. The third portion TL2-1 may be electrically connected to the second detection patterns SP2 of the second detection electrode TE2. In one or more embodiments, each of the plurality of column mesh lines TL2-11, TL2-12, TL2-13, TL2-14, and TL2-15 may be electrically connected to the second detection patterns SP2. The plurality of column mesh lines TL2-11, TL2-12, TL2-13, TL2-14, and TL2-15 may be respectively electrically connected to the plurality of row detection electrodes R1, R2, R3, R4, and R5 included in the second detection electrode TE2. In one or more embodiments, the first column mesh line TL2-11 may be connected to the first row detection electrode R1, the second column mesh line TL2-12 may be connected to the second row detection electrode R2, the third column mesh line TL2-13 may be connected to the third row detection electrode R3, the fourth column mesh line TL2-14 may be connected to the fourth row detection electrode R4, and the fifth column mesh line TL2-15 may be connected to the fifth row detection electrode R5. As the plurality of column mesh lines TL2-11, TL2-12, TL2-13, TL2-14, and TL2-15 are respectively connected to the plurality of different row detection electrodes R1, R2, R3, R4, and R5, the plurality of column mesh lines TL2-11, TL2-12, TL2-13, TL2-14, and TL2-15 may have different lengths extending along the second direction DR2. As shown in FIG. 8, the second column mesh line TL2-12 has a longer extension length in the second direction DR2 than the first column mesh line TL2-11. The third column mesh line TL2-13 has a longer extension length in the second direction DR2 than the first column mesh line TL2-11 and the second column mesh line TL2-12. The fourth column mesh line TL2-14 has a longer extension length in the second direction DR2 than the first column mesh line TL2-11, the second column mesh line TL2-12, and the third column mesh line TL2-13. The fifth column mesh line TL2-15 may have a longer extension length in the second direction DR2 than the first column mesh line TL2-11, the second column mesh line TL2-12, the third column mesh line TL2-13, and the fourth column mesh line TL2-14.

The fourth portion TL2-2 may include a plurality of row wirings TL2-21, TL2-22, TL2-23, TL2-24, and TL2-25 that are respectively electrically connected to a plurality of column mesh lines TL2-11, TL2-12, TL2-13, TL2-14, and TL2-15 included in the third portion TL2-1, and may have at least portion extending in the first direction DR1. The plurality of row wirings TL2-21, TL2-22, TL2-23, TL2-24, and TL2-25 may include a first row wiring TL2-21 connected to the first column mesh line TL2-11, a second row wiring TL2-22 connected to a column mesh line TL2-12, a third row wiring TL2-23 connected to a third column mesh line TL2-13, a fourth row wiring TL2-24 connected to a fourth column mesh line TL2-14, and a fifth row wiring TL2-25 connected to a fifth column mesh line TL2-15. A portion of each of the first row wiring TL2-21, the second row wiring TL2-22, the third row wiring TL2-23, the fourth row wiring TL2-24, and the fifth row wiring TL2-25 may extend along the first direction DR1, and may be spaced apart from each other along the second direction DR2.

The fourth portion TL2-2 may be located to overlap any one of the plurality of row detection electrodes R1, R2, R3, R4, and R5 included in the second detection electrode TE2. In one or more embodiments, the fourth portion TL2-2 may be located to overlap the first row detection electrode R1 in the first direction DR1. The fourth portion TL2-2 might not overlap the detection electrodes in another row along the first direction DR1. That is, the fourth portion TL2-2 may overlap the detection electrode R1 in the first row along the first direction DR1 while not overlapping the second row detection electrode R2, the third row detection electrode R3, the fourth row detection electrode R4, and the fifth row detection electrode R5.

On the other hand, although not shown in FIG. 8, content similar to that described with respect to the second trace line TL2 may be applied to the third trace line TL3 located on the fourth side TE2-S2 of the second detection electrode TE2.

Figure 9:
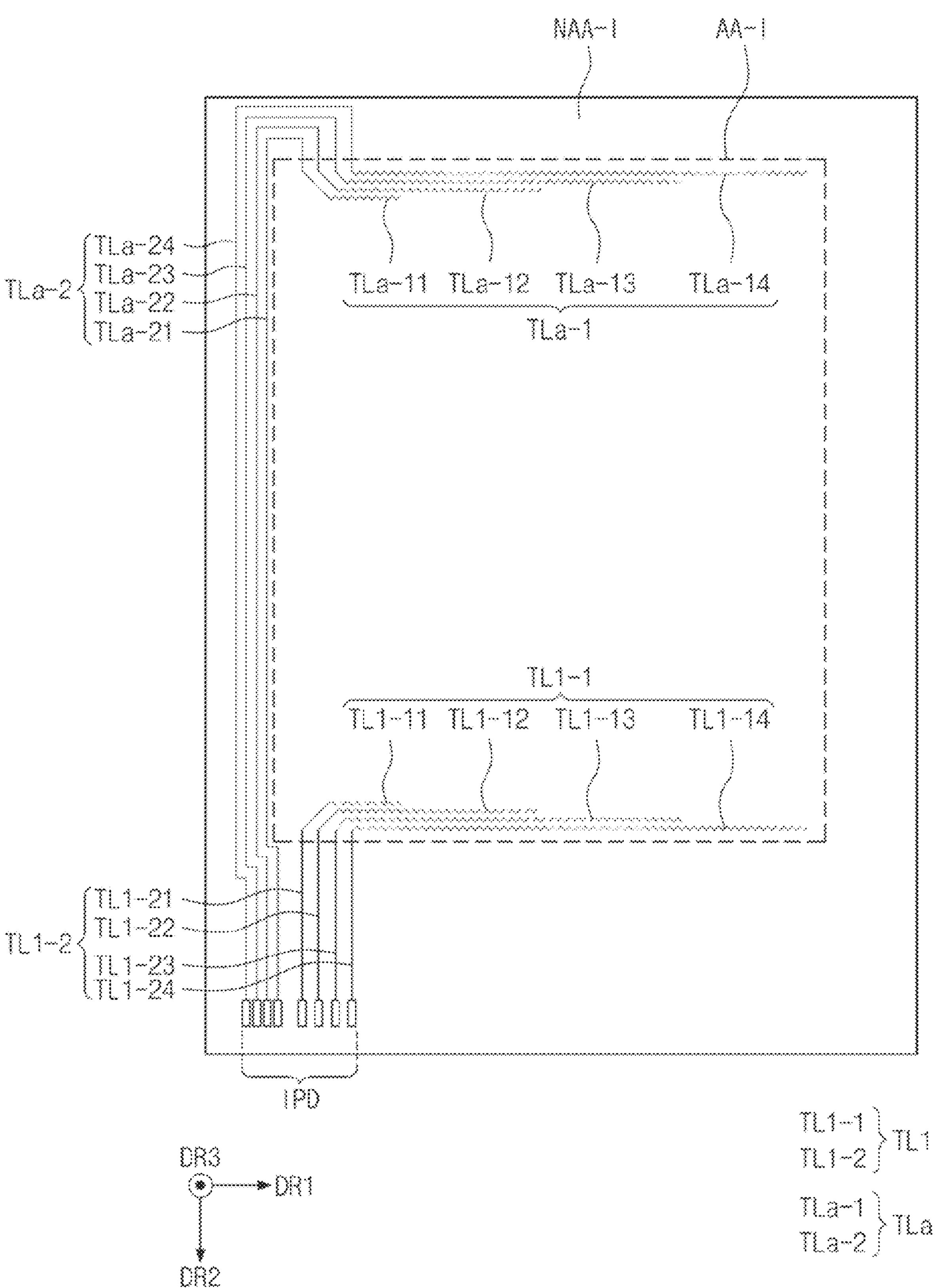
FIG. 9 is a plan view illustrating some configurations of an input sensor according to one or more embodiments of the present disclosure.

FIG. 9 is a plan view illustrating some configurations of an input sensor according to one or more embodiments of the present disclosure. Based on the embodiments corresponding to FIGS. 5A and 6, FIG. 9 illustrates one or more embodiments further including a plurality of additional trace lines TLa located on the second sides TE1-S2 of the first detection electrode TE1 in addition to the plurality of first trace lines TL1 located on the first side TE1-S1 of the first detection electrode TE1. Hereinafter, in describing the input sensor according to embodiments corresponding to FIG. 9, the same reference numerals are given to the components described above, and detailed descriptions thereof will be omitted.

Referring to FIGS. 5A and 9 together, additional trace lines TLa may be located on the second side TE1-S2 of the first detection electrode TE1. Each of the additional trace lines TLa may include a fifth portion TLa-1 and a sixth portion TLa-2.

The fifth portion TLa-1 is a portion located within the active area AA-I, and at least a portion thereof extends in the first direction DR1. The fifth portion TLa-1 includes a plurality of mesh lines. That is, the fifth portion TLa-1 may have a plurality of mesh line shapes extending in the first direction DR1. Meanwhile, the shape of the mesh line described with reference to FIG. 7 may be equally applied to the mesh line shape of the fifth portion TLa-1. That is, the fifth portion TLa-1 may include the first mesh line ML1 and the second mesh line ML2 as shown in FIG. 7.

The sixth portion TLa-2 is electrically connected to the fifth portion TLa-1, and at least a portion thereof extends in the second direction DR2. The sixth portion TLa-2 is a portion located in the peripheral area NAA-I. One end of the sixth portion TLa-2 may be connected to the fifth portion TLa-1, and the other end may be connected to a plurality of detection pads located on the input pad part IPD.

The fifth portion TLa-1 includes a plurality of additional row mesh lines TLa-11, TLa-12, TLa-13, and TLa-14 each extending in the first direction DR1. The plurality of additional row mesh lines TLa-11, TLa-12, TLa-13, and TLa-14 may include a 1-1 row mesh line TLa-11, a 2-1 row mesh line TLa-12, a 3-1 row mesh line TLa-13, and a 4-1 row mesh line TLa-14. At least portion of each of the 1-1 row mesh line TLa-11, the 2-1 row mesh line TLa-12, the 3-1 row mesh line TLa-13, and the 4-1 row mesh line TLa-14 may extend in the first direction DR1 and may be spaced apart from each other in the second direction DR2.

The fifth portion TLa-1 is located in the active area AA-I, and may be electrically connected to some of the plurality of detection electrodes TE. The fifth portion TLa-1 may be electrically connected to the first detection patterns SP1 of the first detection electrode TE1. In one or more embodiments, each of the plurality of additional row mesh lines TLa-11, TLa-12, TLa-13, and TLa-14 included in the fifth portion TLa-1 may be electrically connected to the first detection patterns SP1. The plurality of additional row mesh lines TLa-11, TLa-12, TLa-13, and TLa-14 may be respectively electrically connected to the plurality of column detection electrodes C1, C2, C3, and C4 included in the first detection electrode TE1. In one or more embodiments, the 1-1 row mesh line TLa-11 may be connected to the first column detection electrode C1, the 2-1 row mesh line TLa-12 may be connected to the second column detection electrode C2, the 3-1 row mesh line TLa-13 may be connected to the third column detection electrode C3, and the 4-1 row mesh line TLa-14 may be connected to the fourth column detection electrode C4. As the plurality of additional row mesh lines TLa-11, TLa-12, TLa-13, and TLa-14 are respectively connected to a plurality of different column detection electrodes C1, C2, C3, and C4, the plurality of additional row mesh lines TLa-11, TLa-12, TLa-13, and TLa-14 may have different lengths extending along the first direction DR1. As shown in FIG. 8, the 2-1 row mesh line TLa-12 may have a longer extension length in the first direction DR1 than the 1-1 row mesh line TLa-11. The 3-1 row mesh line TLa-13 may have a longer extension length in the first direction DR1 than the 1-1 row mesh line TLa-11 and the 2-1 row mesh line TLa-12. The 4-1 row mesh line TLa-14 may have a longer extension length in the first direction DR1 than the 1-1 row mesh line TLa-11, the 2-1 row mesh line TLa-12, and the 3-1 row mesh line TLa-13.

The sixth portion TLa-2 may include a plurality of additional column wirings TLa-21, TLa-22, TLa-23, and TLa-24 that are electrically connected to the plurality of additional row mesh lines TLa-11, TLa-12, TLa-13, and TLa-14, respectively, included in the fifth portion TLa-1, and extend in the second direction DR2. The plurality of additional column wirings TLa-21, TLa-22, TLa-23, and TLa-24 may include a 1-1 column wiring TLa-21 connected to a 1-1 row mesh line TLa-11, a 2-1 column wiring TLa-22 connected to a 2-1 row mesh line TLa-12, a 3-1 column wiring TLa-23 connected to a 3-1 row mesh line TLa-13, and a 4-1 column wiring TLa-24 connected to the 4-1 row mesh line TLa-14. A portion of each of the 1-1 column wiring TLa-21, the 2-1 column wiring TLa-22, the 3-1 column wiring TLa-23, and the 4-1 column wiring TLa-24 may extend along the second direction DR2, and may be spaced apart from each other along the first direction DR1.

The sixth portion TLa-2 may be located to overlap any one of the plurality of column detection electrodes C1, C2, C3, and C4 included in the first detection electrode TE1. In one or more embodiments, the sixth portion TLa-2 may be located to overlap the first column detection electrode C1 in the second direction DR2. The sixth portion TLa-2 might not overlap other column detection electrodes along the second direction DR2. That is, the sixth portion TLa-2 may overlap the first column detection electrode C1 along the second direction DR2, while not overlapping the second column detection electrode C2, the third column detection electrode C3, and the fourth column detection electrode C4.

Figure 10A:
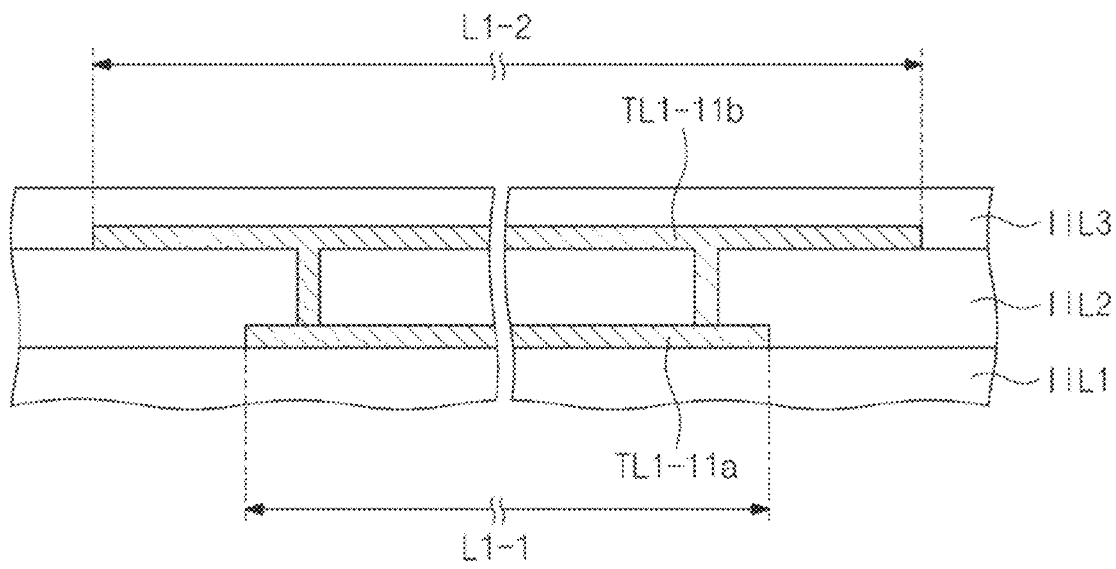
FIGS. 10A and 10B are each a cross-sectional view of a portion of an input sensor according to one or more embodiments of the present disclosure.
Figure 10B:
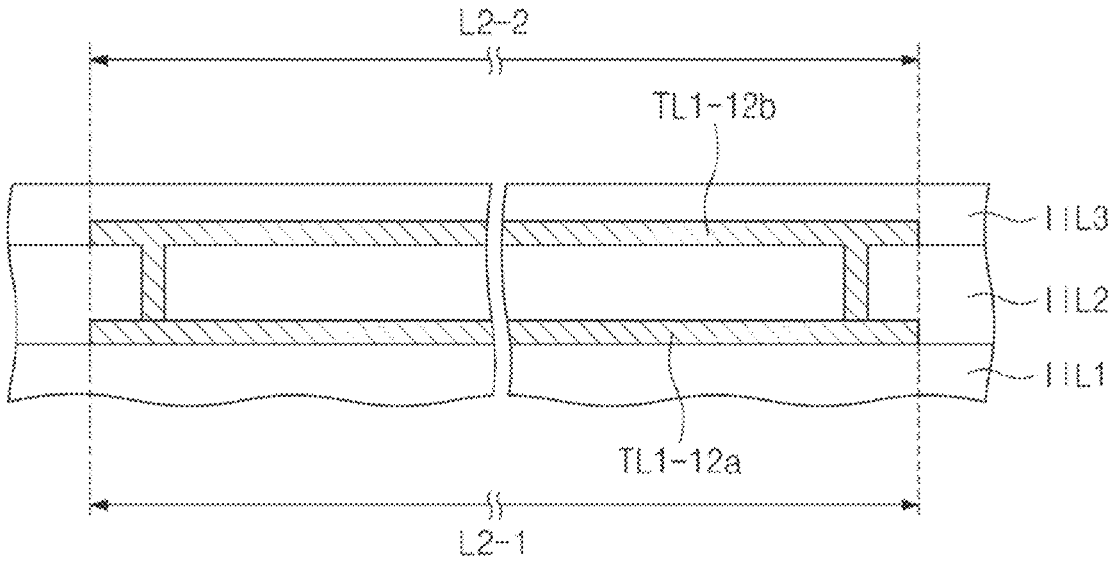

FIGS. 10A and 10B are each a cross-sectional view of a portion of an input sensor according to one or more embodiments of the present disclosure. FIG. 10A shows a cross-section of a first row mesh line among a plurality of row mesh lines included in the first portion of the first trace line shown in FIG. 6, and FIG. 10B shows a cross-section of a second row mesh line among a plurality of row mesh lines included in the first portion of the first trace line shown in FIG. 6.

Referring to FIGS. 3, 6, 10A and 10B together, each of the first row mesh line TL1-11 and the second row mesh line TL1-12 may be wiring having a double-layer structure including wiring included in the first detection conductive layer ICL1 located on the first detection insulating layer IIL1, and wiring included in the second detection conductive layer ICL2 located on the second detection insulating layer IIL2. The first row mesh line TL1-11 may include a 1-1 layer wiring TL1-11*a* located on the first detection insulating layer IIL1, and a 1-2 layer wiring TL1-11*b* located on the second detection insulating layer IIL2. The second row mesh line TL1-12 may include a 2-1 layer wiring TL1-12*a* located on the first detection insulating layer IIL1, and a 2-2 layer wiring TL1-12*b* located on the second detection insulating layer IIL2.

As shown in FIGS. 6, 10A, and 10B, the extension length of the first row mesh line TL1-11 and the second row mesh line TL1-12 may be different from each other. In each of the first row mesh line TL1-11 and the second row mesh line TL1-12, the lengths of wiring included in the second detection conductive layer ICL2 located on the second detection insulating layer IIL2 may be different from each other. In one or more embodiments, the 1-2 extension length L1-2 of the 1-2 layer wiring TL1-11*b* included in the first row mesh line TL1-11 may correspond to the extension length of the first row mesh line TL1-11 shown in FIG. 6, and the 2-2 extension length L2-2 of the 2-2 layer wiring TL1-12*b* included in the second row mesh line TL1-12 may correspond to the extension length of the second row mesh line TL1-12 illustrated in FIG. 6. The 1-2 extension length L1-2 may be shorter than the 2-2 extension length L2-2.

In each of the first row mesh line TL1-11 and the second row mesh line TL1-12, the lengths of wiring included in the first detection conductive layer ICL1 located on the first detection insulating layer IIL1 may be different from each other. In one or more embodiments, the 1-1 extension length L1-1 of the 1-1 layer wiring TL1-11*a* included in the first row mesh line TL1-11, and the 2-1 extension length L2-1 of the 2-1 layer wiring TL1-12*a* included in the second row mesh line TL1-12, may be different from each other. The 1-1 extension length L1-1 may be shorter than the 2-1 extension length L2-1.

With respect to the first row mesh line TL1-11 and the second row mesh line TL1-12 included in the input sensor of one or more embodiments, a ratio of a length of wiring included in the second detection conductive layer ICL2 to a length of wiring included in the first detection conductive layer ICL1 may be different from each other. In one or more embodiments, a ratio of the 1-1 extension length L1-1 to the 1-2 extension length L1-2 may be different from a ratio of the 2-1 extension length L2-1 to the 2-2 extension length L2-2. For example, as shown in FIGS. 10A and 10B, the ratio of the 1-1 extension length L1-1 to the 1-2 extension length L1-2 may be less than the ratio of the 2-1 extension length L2-1 to the 2-2 extension length L2-2. Each of the plurality of row mesh lines included in the input sensor includes wiring of a double-layer structure, and according to the extension length of each row mesh line, a ratio of the length of wiring included in the second detection conductive layer ICL2 to the length of the wiring included in the first detection conductive layer ICL1 may be designed differently. Accordingly, even if the extension length of each row mesh line is different, the resistance value of each row mesh line may be designed to be substantially the same.

Figure 11:
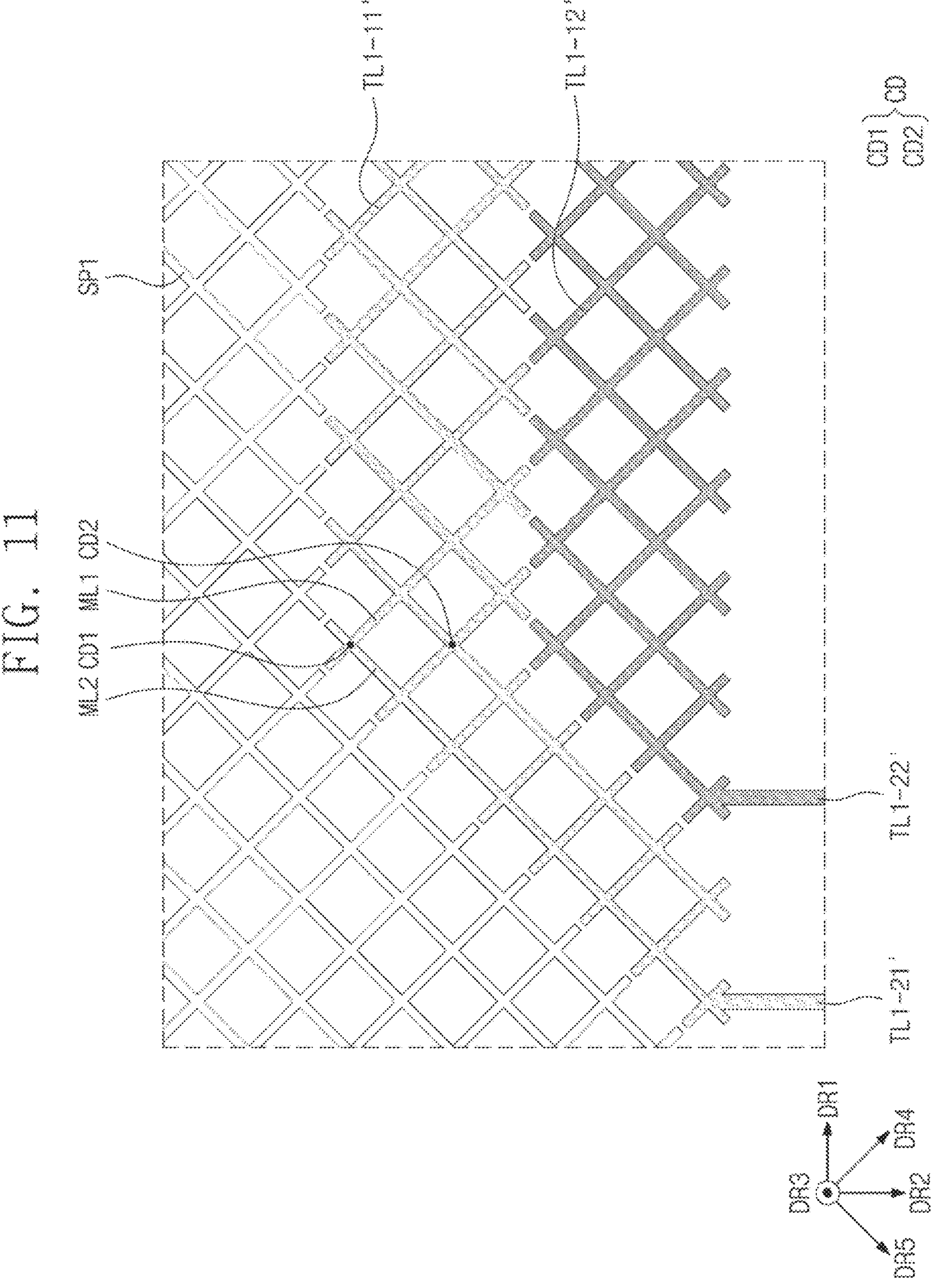
FIGS. 11 and 12 are plan views showing a part of an input sensor according to one or more embodiments of the present disclosure.
Figure 12:
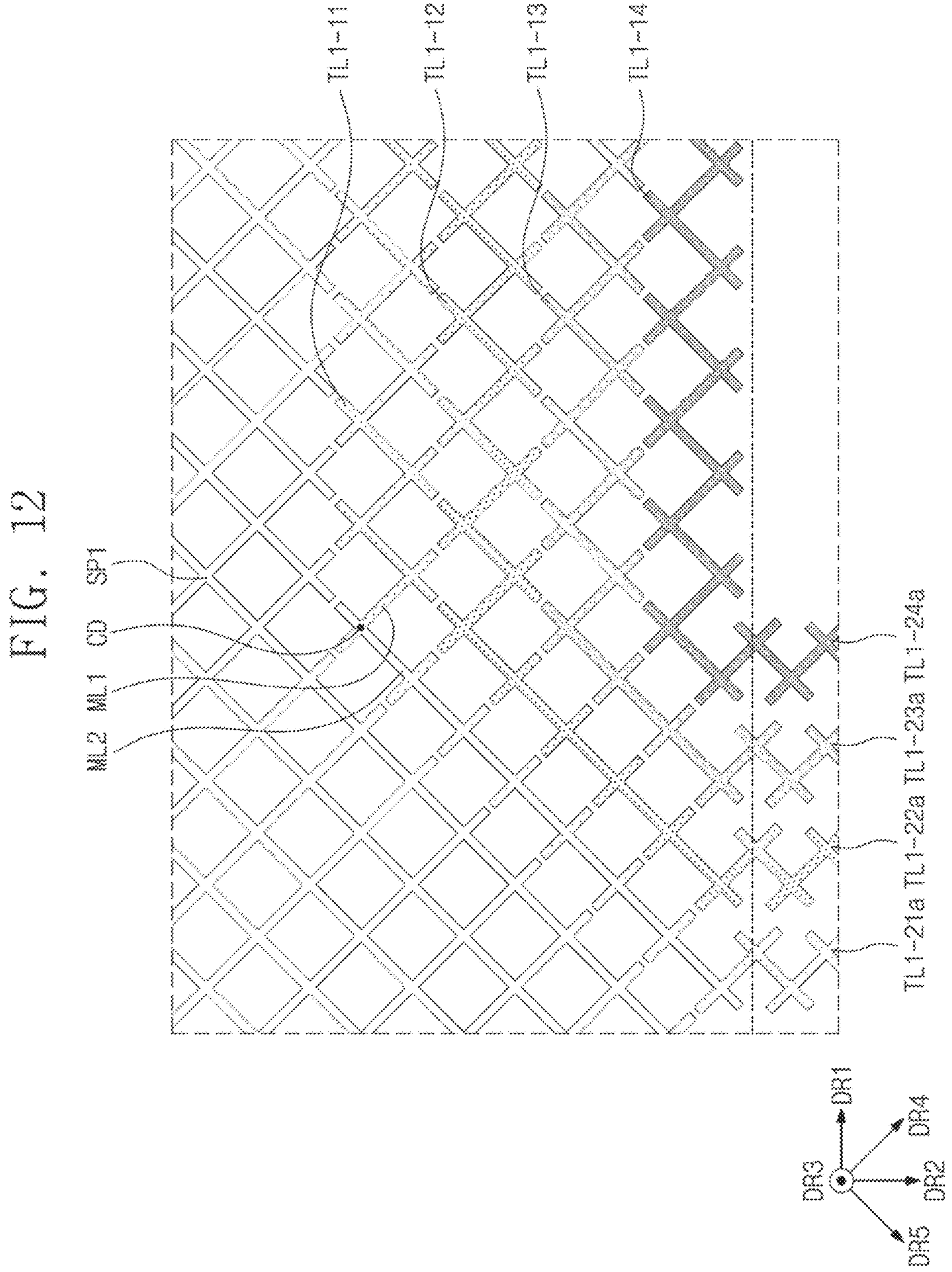

FIGS. 11 and 12 are plan views showing a part of an input sensor according to one or more embodiments of the present disclosure. In the configuration of the input sensor of one or more embodiments that are different from the embodiments corresponding to FIG. 7, a portion where the first portion and the second portion of the first trace line are connected and a portion of the first detection pattern included in the first column detection electrode adjacent thereto are enlarged and shown in FIGS. 11 and 12. Hereinafter, the same reference numerals are given to the same components as those previously described in FIG. 7, and repeated detailed descriptions thereof will be omitted.

Referring to FIG. 11, each of the plurality of row mesh lines TL1-11' and TL1-12' may include a first mesh line ML1 extending in a first diagonal direction DR4 that is a direction between the first direction DR1 and the second direction DR2, and may include a second mesh line ML2 extending in a second diagonal direction DR5 crossing the first diagonal direction DR4. The first mesh line ML1 and the second mesh line ML2 may cross each other. The intersection point CD at which the first mesh line ML1 and the second mesh line ML2 cross each other may be provided as an intersection point row arranged along the first direction DR1.

The plurality of column mesh lines TL1-21' and TL1-22' may include a first column wiring TL1-21' connected to a first row mesh line TL1-11', and a second column wiring TL1-22' connected to a second row mesh line TL1-12'. Each of the first column wiring TL1-21' and the second column wiring TL1-22' may extend along the second direction DR2, and may be spaced apart from each other along the first direction DR1.

The intersection point CD may include a first intersection point CD1 and a second intersection point CD2. The first intersection point CD1 and the second intersection point CD2 may be spaced apart from each other in the second direction DR2, and respective rows of multiples thereof may be arranged to be parallel along the first direction DR1. Each of the first intersection point CD1 and the second intersection point CD2 may be provided as a row of intersection points arranged along the first direction DR1. In the input sensor of one or more embodiments corresponding to FIG. 11, each of the plurality of row mesh lines TL1-11' and TL1-12' may have an increased number of mesh lines crossing as compared with the embodiments corresponding to FIG. 7. That is, each of the plurality of row mesh lines TL1-11' and TL1-12' illustrated in FIG. 11 may have an increased width in the second direction DR2 as compared to the embodiments corresponding to FIG. 7.

Referring to FIG. 12, the plurality of column wirings TL1-21*a*, TL1-22*a*, TL1-23*a*, and TL1-24*a* may include a first column wiring TL1-21*a* connected to a first row mesh line TL1-11, a second column wiring TL1-22*a* connected to a second row mesh line TL1-12, a third column wiring TL1-23*a* connected to a third row mesh line TL1-13, and a fourth column wiring TL1-24*a* connected to a fourth row mesh line TL1-14. Each of the first column wiring TL1-21*a*, the second column wiring TL1-22*a*, the third column wiring TL1-23*a*, and the fourth column wiring TL1-24*a* may extend along the second direction DR2, and may be spaced apart from each other along the first direction DR1.

Each of the plurality of column wirings TL1-21*a*, TL1-22*a*, TL1-23*a*, and TL1-24*a* may include a column mesh line structure extending along the second direction DR2. As shown in FIG. 12, each of the first column wiring TL1-21*a*, the second column wiring TL1-22*a*, the third column wiring TL1-23*a*, and the fourth column wiring TL1-24*a* may have a column mesh line structure extending along the second direction DR2, and spaced apart from each other along the first direction DR1. Like each of a plurality of row mesh lines TL1-11, TL1-12, TL1-13, and TL1-14, each of the first column wiring TL1-21*a*, the second column wiring TL1-22*a*, the third column wiring TL1-23*a*, and the fourth column wiring TL1-24*a* may include a first mesh line ML1 extending in the first diagonal direction DR4 and a second mesh line ML2 extending in the second diagonal direction DR5. In the input sensor according to one or more embodiments, in addition to the plurality of row mesh lines TL1-11, TL1-12, TL1-13, and TL1-14 included in the first portion of the first trace line, the plurality of column wirings TL1-21*a*, TL1-22*a*, TL1-23*a*, and TL1-24*a* included in the second portion may also be formed to have a mesh line structure. Accordingly, it is possible to form the first portion and the second portion of the first trace line through the same mask process, so that it is possible to form an integrated trace line without an additional process.

According to the display device of one or more embodiments of the present disclosure, while the area of the part where the trace wiring included in the input sensor is arranged in the peripheral area is reduced or minimized, it is possible to form an integrated detection electrode and trace line without additional processing, such that it is possible to provide an input sensor and a display device with a reduced or minimized dead space through a simplified process.

Although the embodiments of the present disclosure have been described, it is understood that the present disclosure should not be limited to these embodiments, but various changes and modifications may be made by one ordinary skilled in the art within the spirit and scope of the present disclosure as hereinafter claimed.

What is claimed is:

1. An electronic device comprising:

a display panel comprising a display area, and a non-display area adjacent to the display area; and an input detection layer on the display panel, and comprising:

first electrodes arranged spaced apart along a first direction and extending in a second direction crossing the first direction; and first trace lines electrically connected one-to-one to the first electrodes at ends of the first electrodes in the second direction, and comprising:

first mesh portions overlapping the display area and extending in the first direction along a boundary of the display area and the non-display area; and line portions respectively extending from the first mesh portions in the second direction, wherein the first mesh portions are between the first electrodes and the boundary of the display area and the non-display area in the second direction.

2. The electronic device of claim 1, wherein the first electrodes, the first mesh portions, and the boundary are arranged sequentially along the second direction.

3. The electronic device of claim 1, wherein the first mesh portions are arranged spaced apart along the second direction.

4. The electronic device of claim 1, wherein the input detection layer further comprises pads electrically connected one-to-one to the first trace lines, and wherein the pads are arranged along the first direction.

5. The electronic device of claim 4, wherein the pads overlap with the non-display area.

6. The electronic device of claim 4, wherein the line portions extend from the boundary of the display area and the non-display area toward the pads.

7. The electronic device of claim 6, wherein shapes of the line portions are different from shapes of the first mesh portions.

8. The electronic device of claim 6, wherein a maximum width of each of the first mesh portions in the second direction is greater than a width of each of the line portions in the first direction.

9. The electronic device of claim 1, wherein the display panel further comprises light-emitting areas in the display area, and wherein some of the light-emitting areas are between one of the first mesh portions and another of the first mesh portions.

10. The electronic device of claim 1, wherein the first mesh portions comprise a first mesh line extending in a first diagonal direction, which is between the first direction and the second direction and a second mesh line extending from the first mesh line in a second diagonal direction intersecting the first diagonal direction.

11. The electronic device of claim 1, wherein the first electrodes extend along the second direction.

12. The electronic device of claim 1, wherein the input detection layer further comprises second electrodes spaced apart along the second direction, and second trace lines electrically connected one-to-one to the second electrodes and comprising second mesh portions overlapping the display area and extending along the second direction.

13. An electronic device comprising:

a display panel comprising a display area and a non-display area adjacent to the display area; and an input detection layer on the display panel, and comprising:

first electrodes arranged spaced apart along a first direction;

first trace lines electrically connected one-to-one to the first electrodes, and comprising:

first mesh portions overlapping the display area and extending along the first direction; and line portions respectively extending from the first mesh portions in a second direction crossing the first direction; and pads electrically connected one-to-one to the first trace lines, arranged along the first direction.

14. The electronic device of claim 13, wherein the first line portions extend from the first mesh portions toward the pads.

15. The electronic device of claim 14, wherein a maximum width of each of the first mesh portions in the second direction is greater than a width of each of the line portions in the first direction.

16. An electronic device comprising:

a display panel comprising a display area and a non-display area adjacent to the display area; and an input detection layer on the display panel, and comprising:

first electrodes arranged spaced apart along a first direction; and first trace lines electrically connected one-to-one to the first electrodes, and comprising first mesh portions extending in the first direction and overlapping the display area and line portions extending in a second direction intersecting the first direction and overlapping the non-display area, a maximum width of each of the first mesh portions in the second direction being greater than a width of each of the line portions in the first direction.

17. The electronic device of claim 16, wherein the input detection layer further comprises pads electrically connected one-to-one to the first trace lines and arranged along the first direction.

18. The electronic device of claim 16, wherein the first mesh portions comprise a first mesh line extending in a first diagonal direction, which is between the first direction and the second direction, and a second mesh line extending from the first mesh line in a second diagonal direction intersecting the first diagonal direction.

19. The electronic device of claim 18, wherein a width of the first mesh line and the second mesh line is less than the width of the first mesh portions.

* * * * *